United States Patent [19]
Yoshinouchi et al.

[11] Patent Number: 6,130,455
[45] Date of Patent: Oct. 10, 2000

[54] SEMICONDUCTOR DEVICE, THIN FILM TRANSISTOR HAVING AN ACTIVE CRYSTAL LAYER FORMED BY A LINE CONTAINING A CATALYST ELEMENT

[75] Inventors: Atsushi Yoshinouchi, Kashiba; Yasuaki Murata, Nara, both of Japan

[73] Assignee: Sharp Kabushiki Kaisha, Osaka, Japan

[21] Appl. No.: 08/825,672

[22] Filed: Mar. 20, 1997

[30] Foreign Application Priority Data

Mar. 21, 1996 [JP] Japan ..................................... 8-065030

[51] Int. Cl.⁷ .................................................... H01C 29/78
[52] U.S. Cl. .............................. 257/347; 257/53; 257/66; 257/72; 257/348; 257/349; 257/350; 257/57; 257/59
[58] Field of Search ................................. 257/53, 66, 72, 257/347–350, 57, 59

[56] References Cited

U.S. PATENT DOCUMENTS 5,646,424  7/1997  Zhang et al. ............................... 257/66
5,886,364  3/1999  Zhang ....................................... 257/53

FOREIGN PATENT DOCUMENTS 6-244103  9/1994  Japan .
7-54386   6/1995  Japan .

*Primary Examiner*—Fetsum Abraham
*Attorney, Agent, or Firm*—Nixon & Vanderhye, P.C.

[57] ABSTRACT

A semiconductor device includes: a substrate; a line formed on the substrate; and a crystalline semiconductor film containing silicon connected to the line. The crystalline semiconductor film is crystallized by annealing where a constituting material of the line functions as a catalyst.

10 Claims, 8 Drawing Sheets

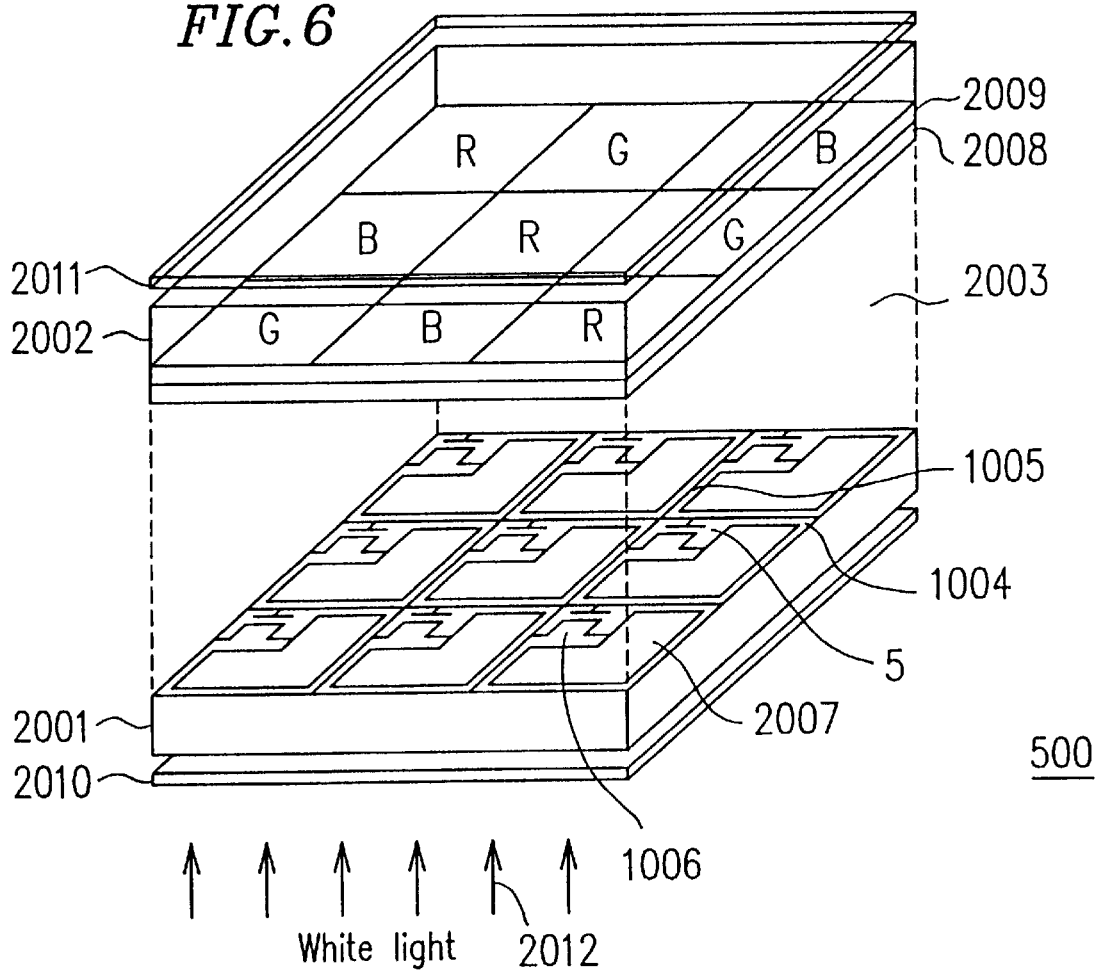

SEMICONDUCTOR DEVICE, THIN FILM TRANSISTOR HAVING AN ACTIVE CRYSTAL LAYER FORMED BY A LINE CONTAINING A CATALYST ELEMENT

BACKGROUND OF THE INVENTION

1. Field of the Invention

The present invention relates to a semiconductor device, such as a thin film transistor, which is appropriately used in a liquid crystal display, an image sensor, a solar cell, etc. The present invention also relates to a method for producing the same and to a method for producing a liquid crystal display apparatus utilizing such a semiconductor device.

2. Description of the Related Art

Recently, when producing a liquid crystal display, an image sensor and the like, there is a need for producing a semiconductor device such as a thin film transistor on a transparent insulating substrate so that the driving circuit, which is to be externally mounted in prior art, is mounted on the same substrate as the liquid display, the image sensor, etc. Accordingly, various production techniques are being developed.

For example, when producing a thin film transistor (TFT) on a substrate, a production method including the step of implanting impurity ions to a semiconductor film which becomes a device formation region (active region) while using the gate electrode as a mask, thereby self-aligningly forming an n-type or p-type source/drain region, is useful because a channel length of the TFT to be formed can readily be shortened for higher levels of performance. Accordingly, its development is in progress.

In order to realize lower production cost, it is preferable to use an inexpensive glass plate as a substrate. For that purpose, it is necessary that the process temperature typically be about 600° C. (preferably about 500° C. or less) when heat resistivity of the glass substrate is under consideration. However, it is difficult to form a silicon semiconductor film of excellent quality at such a low temperature.

For example, if a polycrystalline silicon semiconductor film is to be formed at a low temperature of about 600° C. or less, it is generally preferable that an amorphous silicon semiconductor film is first grown on a substrate. Then, the amorphous silicon semiconductor film is annealed for crystallization (solid-phase growth) so as to obtain the polycrystalline silicon semiconductor film. The reason is that the polycrystalline silicon semiconductor film having a large crystalline granular radius and excellent characteristics can be obtained.

However, in order to have the crystallization mentioned in the above process, it is generally necessary to perform annealing at about 600° C for about 12 hours (preferably for about 24 hours). Heat treatment for longer hours is also required for a semiconductor device having higher field effect mobility or higher reliability.

However, longer hours of annealing results in a low throughput. Moreover, if annealing is performed at high annealing temperature for long hours, then the glass substrate may experience irreversible thermal contraction or warping. In order to resolve this situation, it is necessary to cope with two problems, one of which is to lower the annealing temperature and the other of which is to shorten the processing hours.

Described in Japanese Laid-Open Patent Publication No. 6-244103 as one of the solutions to the above-mentioned problem is a method where, by using a catalyst such as nickel (Ni) or the like, the crystallization of the amorphous silicon semiconductor film is performed at a temperature lower than the typical crystallization temperature. However, it is also described in the publication that the Ni atoms (catalyst) themselves are not desirable in the silicon film which is present as a semiconductor material. For this reason, in order to guarantee high quality of the crystalline silicon semiconductor film and high performance of the semiconductor device such as TFT which is formed of such a crystalline silicon semiconductor film, it is necessary to remove the Ni atoms (catalyst) which were added and used in the crystallization step.

Alternatively, in the case where such step of removing the catalyst element is not performed, it is necessary to control a concentration of catalyst element to be introduced to such a degree that the concentration is sufficient for prompting the crystallization of the amorphous silicon semiconductor film and, at the same time, the catalyst element which remains in the crystalline silicon semiconductor film does not have a negative effect on the characteristics of the crystalline silicon semiconductor film. However, the concentration of the catalyst element satisfying such requirements is typically very small. Accordingly, it is extremely difficult to realize the step of introducing the catalyst element while accurately controlling its concentration.

In addition to the above-described problem, in order to lower the production cost for a liquid crystal display or the like, it is strongly desired that the number of masks for photolithography needed during production be reduced, thereby simplifying the production steps. If the number of masks is reduced, then the production steps are simplified and a throughput and a production yield improve, thereby greatly reducing the production cost. However, the production method described in the conventional art requires more number of masks than generally needed, and therefore the above-mentioned objective, i.e., the simplification of the production steps, becomes difficult to achieve.

SUMMARY OF THE INVENTION

The semiconductor device of this invention includes a substrate; a line formed on said substrate; and a crystalline semiconductor film containing silicon connected to said line; wherein said crystalline semiconductor film is crystallized by annealing where a constituting material of said line functions as a catalyst.

In one embodiment of the invention, the device further includes an insulating film formed on said line, wherein said crystalline semiconductor film is connected to said line through a contact hole formed in said insulating film.

In another embodiment of the invention, the line is formed of a single layer film or of a multi-layer film made of a constituting material containing at least one material selected from the group consisting of nickel, iron, cobalt and platinum.

According to another aspect of the invention, a thin film transistor is provided. The thin film transistor includes a substrate; a line formed on said substrate; a crystalline semiconductor film containing silicon connected to said line; a gate insulating film formed on said crystalline semiconductor film; and a gate electrode formed on said gate insulating film; wherein said crystalline semiconductor film is crystallized by annealing where a constituting material of said line functions as a catalyst.

In one embodiment of the invention, the thin film transistor includes an insulating film formed on said line, wherein said crystalline semiconductor film is connected to said line through a contact hole formed in said insulating film.

In another embodiment of the invention, said crystalline semiconductor film includes a source region and a drain region; and said source region and said drain region are selectively doped with a group III element or a group V element as an impurity.

In still another embodiment of the invention, said impurity is doped self-aligningly with said gate electrode being used as a mask.

In still another embodiment, the thin film transistor further includes a shielding film formed on said substrate in the same step as for said line.

In still another embodiment, said line is formed of a single layer film or of a multi-layer film made of a constituting material containing at least one material selected from the group consisting of nickel, iron, cobalt and platinum.

According to still another aspect of the invention, a liquid crystal display apparatus is provided. The divide includes one of the above thin film transistors.

According to still another aspect of the invention, a method for producing a thin film transistor is provided. The method includes the steps of: forming a line on a substrate; forming a semiconductor film containing silicon and including an amorphous portion so as to be connected to said line; performing annealing for crystallizing said semiconductor film including said amorphous portion with a constituting material of said line being used as a catalyst, so as to obtain a crystalline semiconductor film containing silicon; forming a gate insulating film on said crystalline semiconductor film; and forming a gate electrode on said gate insulating film.

In one embodiment of the invention, the method further comprising: forming an insulating film on said line; and forming a contact hole in said insulating film, and connecting said crystalline semiconductor film to said line through said contact hole.

In another embodiment of the invention, the method further comprising the step of selectively doping a predetermined region of said crystalline semiconductor film with a group III element or a group V element as an impurity so as to form a source region and a drain region.

In still another embodiment of the invention, said impurity is doped self-aligningly with said gate electrode being used as a mask.

In still another embodiment of the invention, a shielding film is further formed on said substrate in the step of forming said line.

In still another embodiment of the invention, a process temperature for the annealing for crystallization is lower than the crystallization temperature for amorphous silicon by about 20° C. to about 150° C.

In still another embodiment of the invention, the line is formed of a single layer film or of a multi-layer film made of a constituting material containing at least one material selected from the group consisting of nickel, iron, cobalt and platinum.

According to still another aspect of the invention, a method for producing a liquid crystal display apparatus is provided. The method includes one of the methods for producing thin film transistors cited above.

Thus, the invention described herein makes possible the advantages of (1) providing a semiconductor device or a thin film transistor having excellent mass producibility and low production cost, yet having excellent operational characteristics, and a method for producing the same, and of (2) a liquid crystal display apparatus using such devices and having low production cost yet having high display definition, and a method for producing the same.

Hereinafter, the functions of the present invention will be described.

Because of the above-described structure, the semiconductor device or the thin film transistor according to the present invention can be readily produced in a fewer number of production steps. For example, the number of photolithographic masks needed for the production becomes small.

Furthermore, because of the lines formed of a single layer film or a multi-layer film made of a material containing at least one of nickel, iron, cobalt and platinum, the crystallization proceeds with the above-mentioned material functioning as a catalyst, starting with the portion which is in contact with the lines, and the semiconductor film having excellent crystallinity can be obtained in the annealing for the crystallization of the silicon-containing semiconductor film including amorphous portion. Accordingly, as described in Japanese Laid-Open Patent Publication No. 6-244103, the silicon-containing semiconductor film having excellent crystallinity can be obtained by annealing at a temperature lower than the typical crystallization temperature for amorphous silicon by about 20° C. to about 150° C. If the annealing temperature can be lowered, then an inexpensive glass substrate having low heat resistance can be used.

Furthermore, in the above-described structure, the catalyst material for the crystallization also serves as a constituting material of the lines. Therefore, not like the case where a thin film for introducing the catalyst element is provided, it is not necessary to perform the step for removing the portion including the catalyst after the production of the semiconductor apparatus or the thin film transistor. Accordingly, the production steps can be simplified. Moreover, fine control of the concentration of introduced catalyst is not required, and excellent uniformity of devices to be formed as well as excellent repeatability can be achieved. The device is thus suited for mass production.

The bulk resistivities for nickel, iron, cobalt and platinum are about 7.2 $\mu\Omega\cdot$cm, about 9.8 $\mu\Omega\cdot$cm, about 6.4 $\mu\Omega\cdot$cm and about 10.6 $\mu\Omega\cdot$cm, respectively. These values are lower than those for Ta (about 15 $\mu\Omega\cdot$cm) or Cr (about 17 $\mu\Omega\cdot$cm), which are often used as a material for the lines. Therefore, the low resistivity of lines can be realized.

If the shielding film is simultaneously formed when the lines are formed on the substrate, the thin film transistor having excellent light resistivity can be obtained without increasing the number of production steps.

Furthermore, by using the thin film transistor which has the simple structure as described above as well as the excellent crystallinity and operational characteristics, the liquid crystal display apparatus which has high display definition can be easily and inexpensively obtained.

These and other advantages of the present invention will become apparent to those skilled in the art upon reading and understanding the following detailed description with reference to the accompanying figures.

BRIEF DESCRIPTION OF THE DRAWINGS

FIG. 6 is an isometric view of a display unit of the liquid crystal display apparatus shown in FIG. 5;

DESCRIPTION OF THE PREFERRED EMBODIMENTS (Embodiment 1)

Figure 1:
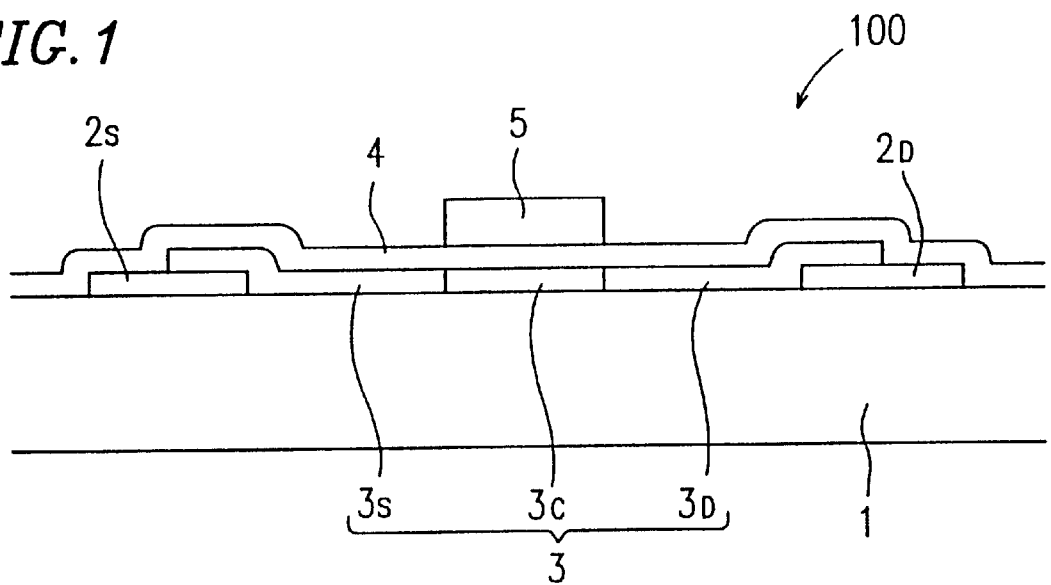
FIG. 1 is a cross-sectional view illustrating the structure of a thin film transistor according to a first embodiment of the present invention.

A thin film transistor (hereinafter, referred to as TFT) 100 according to a first embodiment of the present invention will be described with reference to FIG. 1. FIG. 1 is a cross-sectional view illustrating the structure of the TFT 100.

The TFT 100 is formed on a substrate 1 which has an insulating surface (hereinafter, referred to as an "insulating substrate"). Those which can be used as the insulating substrate 1 include a glass substrate, a quartz substrate, a sapphire substrate, or a mono-crystalline silicon wafer substrate having an insulating layer formed on its surface.

When a glass substrate is used as an insulating substrate 1, it is preferable to coat the surface of the substrate 1 with a coating film (not shown in the figure) made of an $SiO_2$ film, an $SiN_x$ or the like, so as to prevent the negative effect of the impurity contained in the substrate 1. The thickness of the coating film is, for example, about 100 nm to about 500 nm. Those which can be used as the coating film include an $SiO_2$ film which is formed by atmospheric pressure CVD from an $SiH_4$ gas and an $O_2$ gas used as a material gas at the temperature of about 430° C., and an $SiO_2$ film formed by sputtering, low pressure CVD, plasma CVD or remote plasma CVD. An $SiN_x$ film, an $Al_2O_3$ film or a $Ta_2O_5$ film can also be used. Furthermore, the above-mentioned films can be used in combination.

Provided on the insulating substrate 1 are a source line 2S and a drain line 2D with a predetermined distance being provided therebetween. The source/drain lines 2S and 2D are formed of a single layer film made of a material containing at least one of nickel (Ni), iron (Fe), cobalt (Co) and platinum (Pt) or of a multi-layer film including a film made of such materials as the upper-most surface layer, such as a Ni single layer film, a Ni/Mo laminated layer film and a Ni/Ta laminated layer film. The Ni, Fe, Co or Pt introduced into the source/drain lines 2S and 2D function as the catalyst element which prompts the crystallization during the crystallization step to be described later for forming a semiconductor film containing silicon. Typically, the thickness of the source/drain lines 2S and 2D is about 200 nm to about 500 nm.

A semiconductor film 3 containing silicon (hereinafter referred to as a "silicon-containing semiconductor film") is formed on the surface of the insulating substrate 1 so as to cover the source/drain lines 2S and 2D. Those which can be used as a material for the silicon-containing semiconductor film 3 includes Si or SiGe, or silicon semiconductor containing phosphorus or boron. In the following description, a poly-crystalline silicon film 3 is ultimately obtained as the silicon-containing semiconductor film 3. Typically, the thickness of the silicon-containing semiconductor film 3 is about 30 nm to about 150 nm.

The crystallization of the poly-crystalline film 3 is obtained first by forming the film which contains an amorphous portion and then by annealing the film. During the crystallization, it is not necessary that the whole portion of the semiconductor film 3 be in the amorphous phase before the crystallization. The amorphous portion may be formed as a micro-crystalline semiconductor film or as a poly-crystalline semiconductor film partially in the amorphous phase.

The silicon-containing semiconductor film 3 including an amorphous portion can be formed by plasma CVD at the substrate temperature of about 200° C. to about 300° C. from a material gas including an $SiH_4$ gas and a $H_2$ gas, or by low pressure CVD at the substrate temperature of about 400° C. to about 570° C. from a material gas including an $SiH_4$ gas and an $Si_2H_6$. Then, the annealing is performed so that the crystallization of the silicon-containing semiconductor film 3 proceeds, starting with portions which are in contact with the source/drain lines 2S and 2D which contain the catalyst element for crystallization. During the crystallization, the catalyst element contained in the source/drain lines 2S and 2D is taken into the silicon-containing semiconductor film 3, and is localized at the growth front of the crystallization, thereby prompting the crystallization of the silicon-containing semiconductor film 3.

In the above process, the concentration of the catalyst element becomes high at the growth front of the crystallization. Here, the catalyst element itself is not desirable for the characteristics of the silicon-containing semiconductor film 3 obtained as a result of the crystallization. If the concentration is too high, then the device characteristics are adversely affected. In the above-described crystallization process, since the crystallization of the silicon-containing semiconductor film 3 proceeds from the portions which are in contact with the source/drain lines 2S and 2D, the growth front ultimately comes in the middle between the portion in contact with the source line 2S and the portion in contact with the drain line 2D, and the concentration of the catalyst element becomes extremely high there. Therefore, it is preferable that such region of high concentration of the catalyst element does not come to a position corresponding to the channel region 3C (below the gate electrode 5) of the TFT 100 to be described later. For example, by adjusting positions of the source/drain lines 2S and 2D and the gate electrode 5, or by having different contact areas with the silicon-containing semiconductor film 3 for the source line 2S and the drain line 2D so as to substantially control the crystal growth, the portion of high concentration of the catalyst element can be shifted either to the source region side or to the drain region side.

The crystallinity of the crystallized silicon-containing semiconductor film 3 can be further improved by irradiating it with high intensity light such as laser light and lamp light. If a pulse laser of short wavelength is used as the light source, then damage is advantageously not inflicted to the underlying insulating substrate 1. Those which can be used include a excimer laser such as a XeCl laser (wavelength of 308 nm), a KrF laser (wavelength 248 nm), an ArF laser (wavelength of 193 nm), etc.

The crystallized silicon-containing semiconductor film 3 is patterned in an island configuration in such a manner that a region extending from the source line 2S to the drain line 2D remains. A gate insulating film 4 having the thickness of about 50 nm to about 150 nm is formed so as to cover the patterned silicon-containing semiconductor film 3. As the gate insulating film 4, an $SiO_2$ film which is formed by atmospheric pressure CVD at the temperature of about 430° C. using a material gas including an $SiH_4$ gas and a $O_2$ gas can be used. Alternatively, an $SiO_2$ film which is formed by sputtering, low pressure CVD, plasma CVD or remote plasma CVD can be used as the gate insulating film 4. Moreover, if an $SiO_2$ film which is formed by atmospheric pressure CVD or plasma CVD using TEOS (Tetra-Ethyl-Ortho-Silicate gas: $Si(OC_2H_5)_4$), then the gate insulating film 4 having excellent step coatability can be obtained. Alternatively, instead of the above-described $SiO_2$ film, an $SiN_x$ film, an $Al_2O_3$ film or a $Ta_2O_5$ film can be used alone or in combination.

A gate electrode 5 is formed on the gate insulating film 4. The gate electrode 5 has the thickness of about 200 nm to about 500 nm, and is formed of a poly-crystalline silicon semiconductor film or an amorphous silicon semiconductor film which are formed by low pressure CVD or of an amorphous silicon semiconductor film or a crystalline silicon semiconductor film which are formed by plasma CVD. When any of these silicon semiconductor films is used, an impurity is introduced in order to have low resistivity. Alternately, the gate electrode 5 may be formed by forming a Ta film or a metal film containing Al, AlSi, AlTi, AlSc or the like to the above-described thickness by sputtering. In particular, the metal film containing Al is preferable in that it forms low resistance electrode lines.

The silicon-containing semiconductor film 3 which has been crystallized and patterned is doped with an impurity to a concentration of, for example, about $1\times10^{15}$ $cm^{-2}$ to about $5\times10^{15}$ $cm^{-2}$ with the gate electrode 5 being used as a mask. As a result, a region which is masked with the gate electrode 5 and is not therefore doped with the impurity becomes a channel region 3C of the TFT 100 to be formed, and regions which are not masked and is therefore doped with the impurity become a source region 3S and a drain region 3D of the TFT 100. If the TFT 100 is to be formed as an n-type, then the silicon-containing semiconductor film 3 is doped with an n-type impurity, for example, a group V element such as phosphorous so that the source region 3S and the drain region 3D become n-type semiconductors. On the other hand, if the TFT 100 is to be formed as a p-type, then the silicon-containing semiconductor film 3 is doped with a p-type impurity, for example, a group III element such as boron.

The source line 2S and the drain line 2D can be electrically lead out by etching away the gate insulating film 4 with the gate electrode 5 being used as a mask.

According to the above-described method, the TFT 100 can be easily formed by simple fabrication steps. Three photolithographic masks are required in the above steps, namely, a mask for forming the source/drain lines 2S and 2D, a mask for patterning the silicon-containing semiconductor film 3 and a mask for patterning the gate electrode 5.

Furthermore, since the crystalline semiconductor film containing silicon can be formed by using at least one of Ni, Fe, Co and Pt as the catalyst element, a poly-crystalline semiconductor film having considerably good crystallinity is obtained. Accordingly, the TFT including such poly-crystalline semiconductor film has considerably good operational characteristics. Moreover, since the catalyst element is introduced as a constituting material for the source/drain lines 2S and 2D which are to be included in a finished product, the step of removing constituting elements including the catalyst element after the crystallization step is not necessary.

(Embodiment 2)

Figure 2:
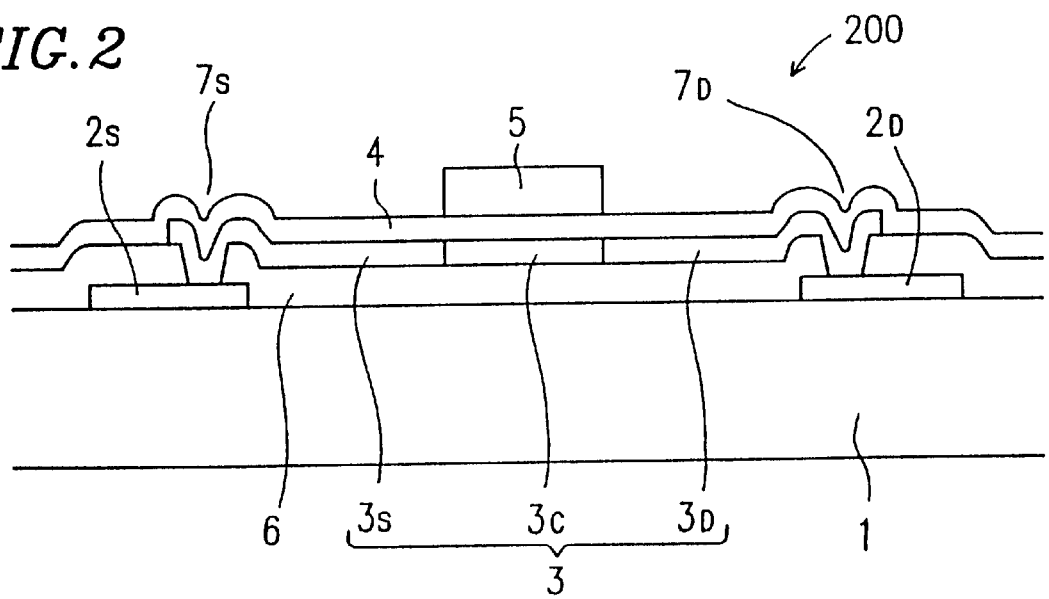
FIG. 2 is a cross-sectional view illustrating the structure of a thin film transistor according to a second embodiment of the present invention.

A thin film transistor (hereinafter referred to as TFT) 200 according to a second embodiment of the present invention will be described with reference to FIG. 2. FIG. 2 is a cross-sectional view illustrating the structure of the TFT 200.

The TFT 200 in FIG. 2 differs from the TFT 100 according to the first embodiment previously described in that a interlayer insulating film 6 which also functions as a coating film is provided on the surface of the insulating substrate 1. This makes it possible to omit the formation of the coating layer. The same constituent elements as in the TFT 100 are designated by the same reference numerals.

The TFT 200 is formed on the insulating substrate 1. Those which can be used as the insulating substrate 1 include a glass substrate, a quartz substrate, a sapphire substrate, or a mono-crystalline silicon wafer substrate having an insulating layer formed on its surface.

Provided on the insulating substrate 1 are a source line 2S and a drain line 2D with a predetermined distance being provided therebetween. The source/drain lines 2S and 2D are formed of a single layer film made of a material containing at least one of nickel (Ni), iron (Fe), cobalt (Co) and platinum (Pt) or of a multi-layer film including a film made of such materials as the upper-most surface layer, such as a Ni single layer film, a Ni/Mo laminated layer film and a Ni/Ta laminated layer film. The Ni, Fe, Co or Pt introduced into the source/drain lines 2S and 2D function as the catalyst element which prompts the crystallization during the crystallization step to be described later for forming a semiconductor film containing silicon. Typically, the thickness of the source/drain lines 2S and 2D is about 200 nm to about 500 nm.

The interlayer insulating film 6 having a thickness of about 100 nm to about 500 nm is formed so as to cover the surface of the insulating substrate 1 and the source/drain lines 2S and 2D. As described above, the interlayer insulating film 6 also functions as the coating film for preventing a negative effect due to the impurity contained in the substrate 1. In order for the interlayer insulating film 6 to function as the coating film, it is preferable that the interlayer insulating film 6 be formed of a $SiO_2$ film or a $SiN_x$ film.

When the interlayer insulating film 6 is formed of a $SiO_2$ film, the interlayer insulating film 6 can be formed by atmospheric pressure CVD at the temperature of about 430° C. using a material gas including a $SiH_4$ gas and an $O_2$ gas. The interlayer insulating film 6 may be formed by sputtering, atmospheric pressure CVD, low pressure CVD, plasma CVD or remote plasma CVD. Moreover, by using the $SiO_2$ film formed by atmospheric pressure CVD or plasma CVD using TEOS, the interlayer insulating film 6 having excellent step coatability can be formed. Alternatively, instead of the above-mentioned $SiO_2$ film, an $SiN_x$ film, an $Al_2O_3$ film or a $Ta_2O_5$ film can be used alone or in combination.

By forming the interlayer insulating film 6 as described above, the withstand voltage between the source/drain lines 2S and 2D and the gate electrode 5 at their intersection improves, and the parasitic capacitance occurring there can be reduced.

Furthermore, contact holes 7S and 7D are formed by etching in the interlayer insulating film 6 at the locations corresponding to the source/drain lines 2S and 2D, respectively. A silicon-containing semiconductor film 3 to be described later makes contact with the source/drain lines 2S and 2D through the contact holes 7S and 7D, respectively.

A silicon-containing semiconductor film 3 is formed on the interlayer insulating film 6. Those which can be used as a material for the silicon-containing semiconductor film 3 includes Si or SiGe, or silicon semiconductor containing phosphorus or boron. In the following description, a poly-crystalline silicon film 3 is ultimately obtained as the silicon-containing semiconductor film 3. Typically, the thickness of the silicon-containing semiconductor film 3 is about 30 nm to about 150 nm.

The crystallization of the poly-crystalline film 3 is obtained first by forming the film which contains an amorphous portion and then by annealing the film. During the crystallization, it is not necessary that the whole portion of the semiconductor film 3 be in the amorphous phase before the crystallization. The amorphous portion may be formed as a micro-crystalline semiconductor film or as a poly-crystalline semiconductor film partially in the amorphous phase.

The silicon-containing semiconductor film 3 including an amorphous portion can be formed by plasma CVD at the substrate temperature of about 200° C. to about 300° C. from a material gas including an $SiH_4$ gas and a $H_2$ gas, or by low pressure CVD at the substrate temperature of about 400° C to about 570° C. from a material gas including an $SiH_4$ gas and an $Si_2H_6$. Then, the annealing is performed so that the crystallization of the silicon-containing semiconductor film 3 proceeds, starting with portions which are in contact with the source/drain lines 2S and 2D which contain the catalyst element for crystallization. During the crystallization, the catalyst element contained in the source/drain lines 2S and 2D is taken into the silicon-containing semiconductor film 3, and is localized at the growth front of the crystallization, thereby prompting the crystallization of the silicon-containing semiconductor film 3.

In the above process, the concentration of the catalyst element becomes high at the growth front of the crystallization. Here, the catalyst element itself is not desirable for the characteristics of the silicon-containing semiconductor film 3 obtained as a result of the crystallization. If the concentration is too high, then the device characteristics are adversely affected. In the above-described crystallization process, since the crystallization of the silicon-containing semiconductor film 3 proceeds from the portions which are in contact with the source/drain lines 2S and 2D, the growth front ultimately comes in the middle between the portion in contact with the source line 2S and the portion in contact with the drain line 2D, and the concentration of the catalyst element becomes extremely high there. Therefore, it is preferable that such region of high concentration of the catalyst element does not come to a position corresponding to the channel region 3C (below the gate electrode 5) of the TFT 200 to be described later. For example, by adjusting positions of the source/drain lines 2S and 2D and the gate electrode 5, or by having different contact areas with the silicon-containing semiconductor film 3 for the source line 2S and the drain line 2D so as to substantially control the crystal growth, the portion of high concentration of the catalyst element can be shifted either to the source region side or to the drain region side.

The crystallinity of the crystallized silicon-containing semiconductor film 3 can be further improved by irradiating it with high intensity light such as laser light and lamp light. If a pulse laser of short wavelength is used as the light source, then damage is preferably not inflicted to the underlying insulating substrate 1. Those which can be used include a excimer laser such as a XeCl laser (wavelength of 308 nm), a KrF laser (wavelength 248 nm), an ArF laser (wavelength of 193 nm), etc.

The crystallized silicon-containing semiconductor film 3 is patterned in an island configuration in such a manner that a region extending from the source line 2S to the drain line 2D remains. A gate insulating film 4 having the thickness of about 50 nm to about 150 nm is formed so as to cover the patterned silicon-containing semiconductor film 3. As the gate insulating film 4, an $SiO_2$ film which is formed by atmospheric pressure CVD at the temperature of about 430° C. using a material gas including an $SiH_4$ gas and a $O_2$ gas can be used. Alternatively, an $SiO_2$ film which is formed by sputtering, low pressure CVD, plasma CVD or remote plasma CVD can be used as the gate insulating film 4. Moreover, if an $SiO_2$ film which is formed by atmospheric pressure CVD or plasma CVD using TEOS, then the gate insulating film 4 having excellent step coatability can be obtained. Alternatively, instead of the above-described $SiO_2$ film, an $SiN_x$ film, an $Al_2O_3$ film or a $Ta_2O_5$ film can be used alone or in combination.

A gate electrode 5 is formed on the gate insulating film 4. The gate electrode 5 has the thickness of about 200 nm to about 500 nm, and is formed of a poly-crystalline silicon semiconductor film or an amorphous silicon semiconductor film which are formed by low pressure CVD or of an amorphous silicon semiconductor film or a crystalline silicon semiconductor film which are formed by plasma CVD. When any of these silicon semiconductor films is used, an impurity is introduced in order to have low resistivity. Alternately, the gate electrode 5 may be formed by forming a Ta film or a metal film containing Al, AlSi, AlTi, AlSc or the like to the above-described thickness by sputtering. In particular, the metal film containing Al is preferable in that it forms low resistance electrode lines.

The silicon-containing semiconductor film 3 which has been crystallized and patterned is doped with an impurity to a concentration of, for example, about $1 \times 10^{15}$ $cm^{-2}$ to about $5 \times 10^{15}$ $cm^{-2}$ with the gate electrode 5 being used as a mask. As a result, a region which is masked with the gate electrode 5 and is not therefore doped with the impurity becomes a channel region 3C of the TFT 200 to be formed, and regions which are not masked and is therefore doped with the impurity become a source region 3S and a drain region 3D of the TFT 200. If the TFT 200 is to be formed as an n-type, then the silicon-containing semiconductor film 3 is doped with an n-type impurity, for example, a group V element such as phosphorous so that the source region 3S and the drain region 3D become n-type semiconductors. On the other hand, if the TFT 200 is to be formed as a p-type, then the silicon-containing semiconductor film 3 is doped with a p-type impurity, for example, a group III element such as boron.

The source line 2S and the drain line 2D can be electrically lead out by etching away the gate insulating film 4 with the gate electrode 5 being used as a mask.

According to the above-described method, the TFT 200 can be easily formed by simple fabrication steps. Four photolithographic masks are required in the above steps, namely, a mask for forming the source/drain lines 2S and 2D, a mask for forming the contact holes 7S and 7D, a mask for patterning the silicon-containing semiconductor film 3 and a mask for patterning the gate electrode 5.

Furthermore, since the crystalline semiconductor film containing silicon can be formed by using at least one of Ni, Fe, Co and Pt as the catalyst element, a poly-crystalline semiconductor film having considerably good crystallinity is obtained. Accordingly, the TFT including such poly-crystalline semiconductor film has considerably good operational characteristics. Moreover, since the catalyst element is introduced as a constituting material for the source/drain lines 2S and 2D which are to be included in a finished product, the step of removing constituting elements including the catalyst element after the crystallization step is not necessary.

(Embodiment 3)

Figure 3:
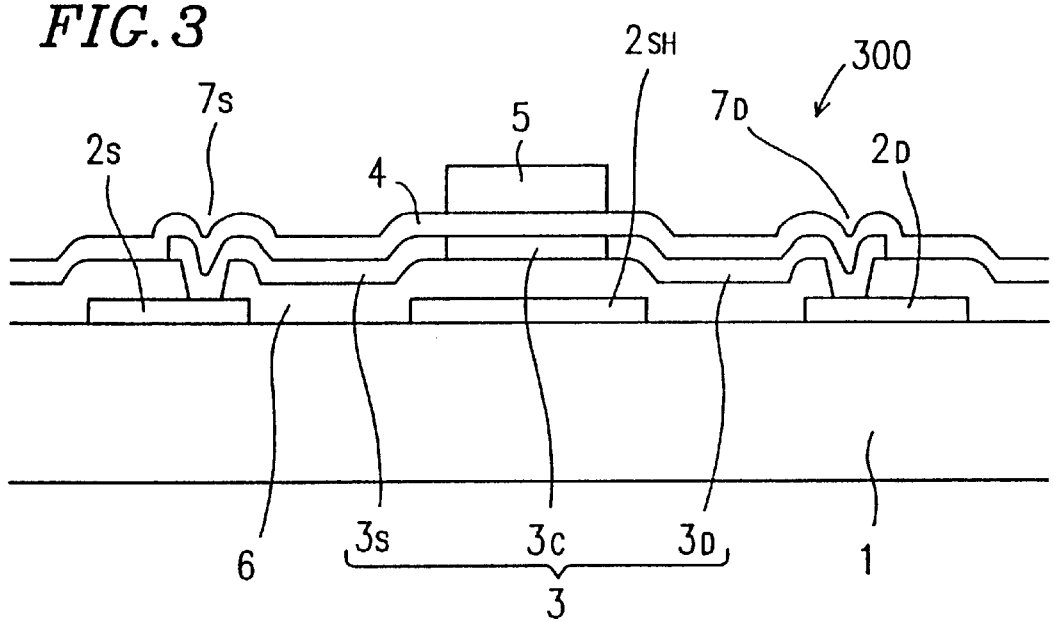
FIG. 3 is a cross-sectional view illustrating the structure of a thin film transistor according to a third embodiment of the present invention.

A thin film transistor (hereinafter referred to as a TFT) 300 according to a third embodiment of the present invention will be described with reference to FIG. 3. FIG. 3 is a cross-sectional view illustrating the structure of the TFT 300.

The TFT 300 in FIG. 3 differs from the TFT 200 according to the second embodiment previously described in that a shielding film 2SH is provided on the surface of the insulating substrate 1 of the TFT 300 at the location between the source line 2S and the drain line 2D. This shielding film 2SH is to prevent light entering from the substrate 1 side from adversely affecting the TFT 300 to be formed. The same constituent elements as in the TFT 200 are designated by the same reference numerals.

The TFT 300 is formed on the insulating substrate 1. Those which can be used as the insulating substrate 1 include a glass substrate, a quartz substrate, a sapphire substrate, or a mono-crystalline silicon wafer substrate having an insulating layer formed on its surface.

Provided on the insulating substrate 1 are a source line 2S and a drain line 2D with a predetermined distance being provided therebetween. Further provided at the location between the source line 2S and the drain line 2D is the shielding film 2SH. The source/drain lines 2S and 2D and the shielding film 2SH are formed of a single layer film made of a material containing at least one of nickel (Ni), iron (Fe), cobalt (Co) and platinum (Pt) or of a multi-layer film including a film made of such materials as the upper-most surface layer, such as a Ni single layer film, a Ni/Mo laminated layer film and a Ni/Ta laminated layer film. The Ni, Fe, Co or Pt introduced into the source/drain lines 2S and 2D and the shielding film 2SH function as the catalyst element which prompts the crystallization during the crystallization step to be described later for forming a semiconductor film containing silicon. Typically, the thickness of the source/drain lines 2S and 2D and the shielding film 2SH is about 200 nm to about 500 nm.

The interlayer insulating film 6 having a thickness of about 100 nm to about 500 nm is formed so as to cover the surface of the insulating substrate 1, the source/drain lines 2S and 2D and the shielding film 2SH. As described above, the interlayer insulating film 6 also functions as the coating film for preventing a negative effect due to the impurity contained in the substrate 1. In order for the interlayer insulating film 6 to function as the coating film, it is preferable that the interlayer insulating film 6 be formed of a $SiO_2$ film or a $SiN_x$ film.

When the interlayer insulating film 6 is formed of a $SiO_2$ film, the interlayer insulating film 6 can be formed by atmospheric pressure CVD at the temperature of about 430° C. using a material gas including a $SiH_4$ gas and an $O_2$ gas. The interlayer insulating film 6 may be formed by sputtering, atmospheric pressure CVD, low pressure CVD, plasma CVD or remote plasma CVD. Moreover, by using the $SiO_2$ film formed by atmospheric pressure CVD or plasma CVD using TEOS, the interlayer insulating film 6 having excellent step coatability can be formed. Alternatively, instead of the above-mentioned $SiO_2$ film, an $SiN_x$ film, an $Al_2O_3$ film or a $Ta_2O_5$ film can be used alone or in combination.

By forming the interlayer insulating film 6 as described above, the withstand voltage between the source/drain lines 2S and 2D and the gate electrode 5 at their intersection improves, and the parasitic capacitance occurring there can be reduced.

Furthermore, contact holes 7S and 7D are formed by etching in the interlayer insulating film 6 at the locations corresponding to the source/drain lines 2S and 2D, respectively. A silicon-containing semiconductor film 3 to be described later makes contact with the source/drain lines 2S and 2D through the contact holes 7S and 7D, respectively.

A silicon-containing semiconductor film 3 is formed on the interlayer insulating film 6. Those which can be used as a material for the silicon-containing semiconductor film 3 includes Si or SiGe, or silicon semiconductor containing phosphorus or boron. In the following description, a poly-crystalline silicon film 3 is ultimately obtained as the silicon-containing semiconductor film 3. Typically, the thickness of the silicon-containing semiconductor film 3 is about 30 nm to about 150 nm.

The crystallization of the poly-crystalline film 3 is obtained first by forming the film which contains an amorphous portion and then by annealing the film. During the crystallization, it is not necessary that the whole portion of the semiconductor film 3 be in the amorphous phase before the crystallization. The amorphous portion may be formed as a micro-crystalline semiconductor film or as a poly-crystalline semiconductor film partially in the amorphous phase.

The silicon-containing semiconductor film 3 including an amorphous portion can be formed by plasma CVD at the substrate temperature of about 200° C. to about 300° C. from a material gas including an $SiH_4$ gas and a $H_2$ gas, or by low pressure CVD at the substrate temperature of about 400° C. to about 570° C. from a material gas including an $SiH_4$ gas and an $Si_2H_6$. Then, the annealing is performed so that the crystallization of the silicon-containing semiconductor film 3 proceeds, starting with portions which are in contact with the source/drain lines 2S and 2D which contain the catalyst element for crystallization. During the crystallization, the catalyst element contained in the source/drain lines 2S and 2D is taken into the silicon-containing semiconductor film 3, and is localized at the growth front of the crystallization, thereby prompting the crystallization of the silicon-containing semiconductor film 3.

In the above process, the concentration of the catalyst element becomes high at the growth front of the crystallization. Here, the catalyst element itself is not desirable for the characteristics of the silicon-containing semiconductor film 3 obtained as a result of the crystallization. If the concentration is too high, then the device characteristics are adversely affected. In the above-described crystallization process, since the crystallization of the silicon-containing semiconductor film 3 proceeds from the portions which are in contact with the source/drain lines 2S and 2D, the growth front ultimately comes in the middle between the portion in contact with the source line 2S and the portion in contact with the drain line 2D, and the concentration of the catalyst element becomes extremely high there. Therefore, it is preferable that such region of high concentration of the catalyst element does not come to a position corresponding to the channel region 3C (below the gate electrode 5) of the TFT 300 to be described later. For example, by adjusting positions of the source/drain lines 2S and 2D and the gate electrode 5, or by having different contact areas with the silicon-containing semiconductor film 3 for the source line 2S and the drain line 2D so as to substantially control the crystal growth, the portion of high concentration of the catalyst element can be shifted either to the source region side or to the drain region side.

The crystallinity of the crystallized silicon-containing semiconductor film 3 can be further improved by irradiating it with high intensity light such as laser light and lamp light. If a pulse laser of short wavelength is used as the light source, then damage is preferably not inflicted to the underlying insulating substrate 1. Those which can be used include a excimer laser such as a XeCl laser (wavelength of 308 nm), a KrF laser (wavelength 248 nm), an ArF laser (wavelength of 193 nm), etc.

The crystallized silicon-containing semiconductor film 3 is patterned in an island configuration in such a manner that a region extending from the source line 2S to the drain line 2D remains. A gate insulating film 4 having the thickness of about 50 nm to about 150 nm is formed so as to cover the patterned silicon-containing semiconductor film 3. As the gate insulating film 4, an $SiO_2$ film which is formed by atmospheric pressure CVD at the temperature of about 430° C. using a material gas including an $SiH_4$ gas and a $O_2$ gas can be used. Alternatively, an $SiO_2$ film which is formed by sputtering, low pressure CVD, plasma CVD or remote plasma CVD can be used as the gate insulating film 4. Moreover, if an $SiO_2$ film which is formed by atmospheric pressure CVD or plasma CVD using TEOS, then the gate insulating film 4 having excellent step coatability can be obtained. Alternatively, instead of the above-described $SiO_2$ film, an $SiN_x$ film, an $Al_2O_3$ film or a $Ta_2O_5$ film can be used alone or in combination.

A gate electrode 5 is formed on the gate insulating film 4. The gate electrode 5 has the thickness of about 200 nm to about 500 nm, and is formed of a poly-crystalline silicon semiconductor film or an amorphous silicon semiconductor film which are formed by low pressure CVD or of an amorphous silicon semiconductor film or a crystalline silicon semiconductor film which are formed by plasma CVD. When any of these silicon semiconductor films is used, an impurity is introduced in order to have low resistivity. Alternately, the gate electrode 5 may be formed by forming a Ta film or a metal film containing Al, AlSi, AlTi, AlSc or the like to the above-described thickness by sputtering. In particular, the metal film containing Al is preferable in that it forms low resistance electrode lines.

The silicon-containing semiconductor film 3 which has been crystallized and patterned is doped with an impurity to a concentration of, for example, about $1 \times 10^{15}$ cm$^{-2}$ to about $5 \times 10^{15}$ cm$^{-2}$ with the gate electrode 5 being used as a mask. As a result, a region which is masked with the gate electrode 5 and is not therefore doped with the impurity becomes a channel region 3C of the TFT 300 to be formed, and regions which are not masked and is therefore doped with the impurity become a source region 3S and a drain region 3D of the TFT 300. If the TFT 300 is to be formed as an n-type, then the silicon-containing semiconductor film 3 is doped with an n-type impurity, for example, a group V element such as phosphorous so that the source region 3S and the drain region 3D become n-type semiconductors. On the other hand, if the TFT 300 is to be formed as a p-type, then the silicon-containing semiconductor film 3 is doped with a p-type impurity, for example, a group III element such as boron.

The source line 2S and the drain line 2D can be electrically lead out by etching away the gate insulating film 4 with the gate electrode 5 being used as a mask.

According to the above-described method, the TFT 300 can be easily formed by simple fabrication steps. Four photolithographic masks are required in the above steps, namely, a mask for forming the source/drain lines 2S and 2D and the shielding film 2SH, a mask for forming the contact holes 7S and 7D, a mask for patterning the silicon-containing semiconductor film 3 and a mask for patterning the gate electrode 5.

Furthermore, since the crystalline semiconductor film containing silicon can be formed by using at least one of Ni, Fe, Co and Pt as the catalyst element, a poly-crystalline semiconductor film having considerably good crystallinity is obtained. Accordingly, the TFT including such poly-crystalline semiconductor film has considerably good operational characteristics. Moreover, since the catalyst element is introduced as a constituting material for the source/drain lines 2S and 2D which are to be included in a finished product, the step of removing constituting elements including the catalyst element after the crystallization step is not necessary.

Furthermore, by providing the shielding film 2SH which can also be formed in the step of forming the source/drain lines 2S and 2D, the TFT 300 having excellent light resistivity can be obtained.

(Embodiment 4)

A method for producing a TFT 400 according to the present invention will be described with reference to FIGS. 4A to 4G. In FIGS. 4A to 4G, the same constituent elements as in the above-described embodiments are designated by the same reference numerals.

The TFT 400 is formed on the insulating substrate 1. Those which can be used as the insulating substrate 1 include a glass substrate, a quartz substrate, a sapphire substrate, or a mono-crystalline silicon wafer substrate having an insulating layer formed on its surface.

First, a single layer made of a material containing at least one of nickel (Ni), iron (Fe), cobalt (Co) and platinum (Pt), or a multi-layer film including a film made of such material as the upper-most surface layer is formed by sputtering or vapor deposition. Examples of such layers include a Ni single layer film, a Ni/Mo laminated layer film, a Ni/Ta laminated layer film, etc. Then, the above-mentioned single layer film or a multi-layer film is patterned by photolithography and etching so as to provide a source line 2S and a drain line 2D with a predetermined distance being provided therebetween as illustrated in FIG. 4A. The Ni, Fe, Co or Pt introduced into the source/drain lines 2S and 2D functions as the catalyst element which prompts the crystallization during the crystallization step to be described later for forming a semiconductor film containing silicon. Typically, the thickness of the source/drain lines 2S and 2D is about 200 nm to about 500 nm.

Figure 4E:
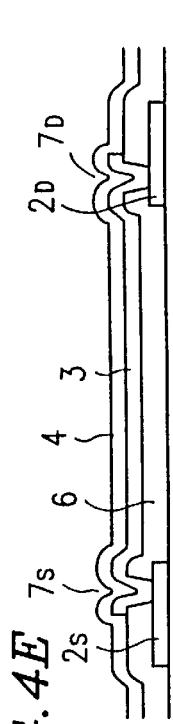
FIGS. 4A to 4G are cross-sectional views illustrating the production steps for the thin film transistor according to the present invention.
Figure 4F:
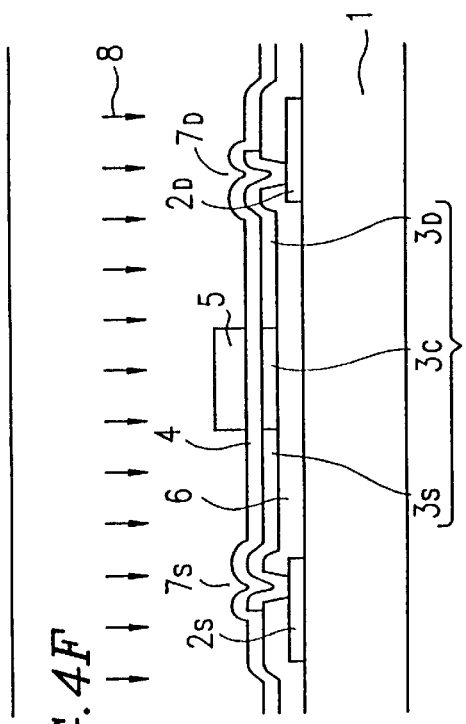
Figure 4G:
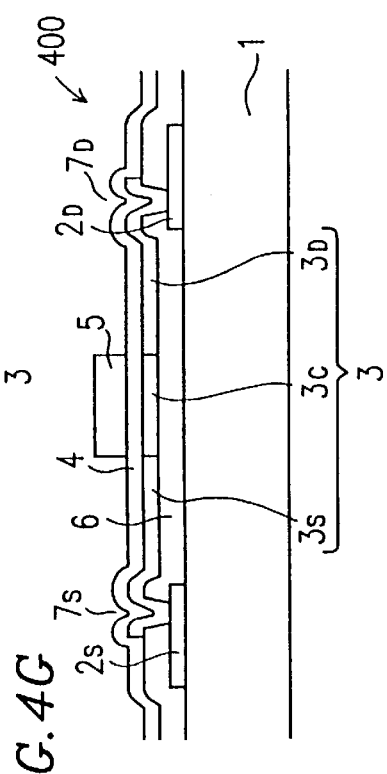
Figure 4A:
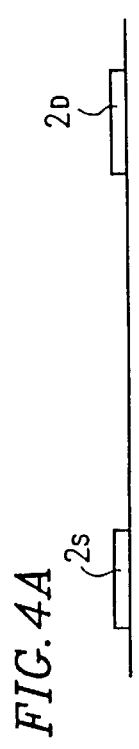
Figure 4B:
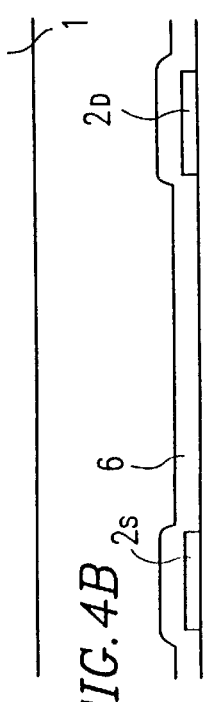

Next, as shown in FIG. 4B, the interlayer insulating film 6 having a thickness of about 100 nm to about 500 nm is formed so as to cover the surface of the insulating substrate 1 and the source/drain lines 2S and 2D. As described in the above embodiments, the interlayer insulating film 6 also functions as the coating film for preventing a negative effect due to the impurity contained in the substrate 1. In order for the interlayer insulating film 6 to function as the coating film, it is preferable that the interlayer insulating film 6 be formed of a $SiO_2$ film or a $SiN_x$ film.

When the interlayer insulating film 6 is formed of a $SiO_2$ film, the interlayer insulating film 6 can be formed by atmospheric pressure CVD at the temperature of about 430° C. using a material gas including a $SiH_4$ gas and an $O_2$ gas. The interlayer insulating film 6 may be formed by sputtering, atmospheric pressure CVD, low pressure CVD, plasma CVD or remote plasma CVD. Moreover, by using the $SiO_2$ film formed by atmospheric pressure CVD or plasma CVD using TEOS, the interlayer insulating film 6 having excellent step coatability can be formed. Alternatively, instead of the above-mentioned $SiO_2$ film, an $SiN_x$ film, an $Al_2O_3$ film or a $Ta_2O_5$ film can be used alone or in combination.

By forming the interlayer insulating film 6 as described above, the withstand voltage between the source/drain lines 2S and 2D and the gate electrode 5 at their intersection improves, and the parasitic capacitance occurring there can be reduced.

Figure 4C:
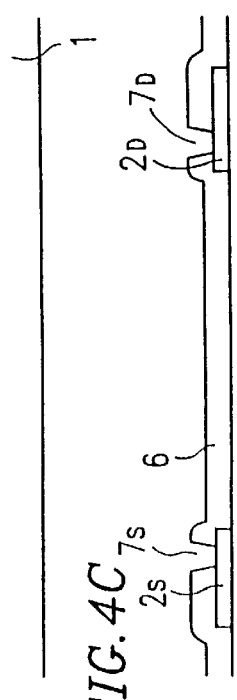

Furthermore, as illustrated in FIG. 4C, contact holes 7S and 7D are formed by etching in the interlayer insulating film 6 at the locations corresponding to the source/drain lines 2S and 2D, respectively.

Figure 4D:
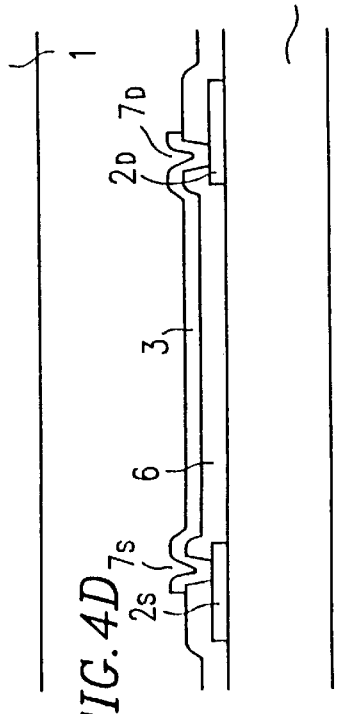

Next, as illustrated in FIG. 4D, a silicon-containing semiconductor film 3 is formed on the interlayer insulating film 6. Those which can be used as a material for the silicon-containing semiconductor film 3 includes Si or SiGe, or silicon semiconductor containing phosphorus or boron. In the following description, a poly-crystalline silicon film 3 is ultimately obtained as the silicon-containing semiconductor film 3. Typically, the thickness of the silicon-containing semiconductor film 3 is about 30 nm to about 150 nm.

The crystallization of the poly-crystalline film 3 is obtained first by forming the film which contains an amorphous portion and then by annealing the film. During the crystallization, it is not necessary that the whole portion of the semiconductor film 3 be in the amorphous phase before the crystallization. The amorphous portion may be formed as a micro-crystalline semiconductor film or as a poly-crystalline semiconductor film partially in the amorphous phase.

The silicon-containing semiconductor film 3 including an amorphous portion can be formed by plasma CVD at the substrate temperature of about 200° C. to about 300° C. from a material gas including an $SiH_4$ gas and a $H_2$ gas, or by low pressure CVD at the substrate temperature of about 400° C. to about 570° C. from a material gas including an $SiH_4$ gas and an $Si_2H_6$. Then, the annealing is performed so that the crystallization of the silicon-containing semiconductor film 3 proceeds, starting with portions which are in contact with the source/drain lines 2S and 2D which contain the catalyst element for crystallization. During the crystallization, the catalyst element contained in the source/drain lines 2S and 2D is taken into the silicon-containing semiconductor film 3, and is localized at the growth front of the crystallization, thereby prompting the crystallization of the silicon-containing semiconductor film 3. By using such catalyst element, an excellent crystalline silicon semiconductor film can be obtained for the annealing temperature which is lower than the crystallization temperature (about 600° C.) for standard amorphous silicon by about 20° C. to about 150° C.

In the above process, the concentration of the catalyst element becomes high at the growth front of the crystallization. Here, the catalyst element itself is not desirable for the characteristics of the silicon-containing semiconductor film 3 obtained as a result of the crystallization. If the concentration is too high, then the device characteristics are adversely affected. In the above-described crystallization process, since the crystallization of the silicon-containing semiconductor film 3 proceeds from the portions which are in contact with the source/drain lines 2S and 2D, the growth front ultimately comes in the middle between the portion in contact with the source line 2S and the portion in contact with the drain line 2D, and the concentration of the catalyst element becomes extremely high there. Therefore, it is preferable that such region of high concentration of the catalyst element does not come to a position corresponding to the channel region 3C (below the gate electrode 5) of the TFT 400 to be described later. For example, by adjusting positions of the source/drain lines 2S and 2D and the gate electrode 5, or by having different contact areas with the silicon-containing semiconductor film 3 for the source line 2S and the drain line 2D so as to substantially control the crystal growth, the portion of high concentration of the catalyst element can be shifted either to the source region side or to the drain region side.

The crystallinity of the crystallized silicon-containing semiconductor film 3 can be further improved by irradiating it with high intensity light such as laser light and lamp light. If a pulse laser of short wavelength is used as the light source, then damage is preferably not inflicted to the underlying insulating substrate 1. Those which can be used include a excimer laser such as a XeCl laser (wavelength of 308 nm), a KrF laser (wavelength 248 nm), an ArF laser (wavelength of 193 nm), etc.

Then, the crystallized silicon-containing semiconductor film 3 is patterned in an island configuration in such a manner that a region extending from the source line 2S to the drain line 2D remains. Here, the crystallization step and the patterning step for the silicon-containing semiconductor film 3 is interchangeable.

Next, as illustrated in FIG. 4E, a gate insulating film 4 having the thickness of about 50 nm to about 150 nm is formed so as to cover the patterned silicon-containing semiconductor film 3. As the gate insulating film 4, an $SiO_2$ film which is formed by atmospheric pressure CVD at the temperature of about 430° C. using a material gas including an $SiH_4$ gas and a $O_2$ gas can be used. Alternatively, an $SiO_2$ film which is formed by sputtering, low pressure CVD, plasma CVD or remote plasma CVD can be used as the gate insulating film 4. Moreover, if an $SiO_2$ film which is formed by atmospheric pressure CVD or plasma CVD using TEOS, then the gate insulating film 4 having excellent step coatability can be obtained. Alternatively, instead of the above-described $SiO_2$ film, an $SiN_x$ film, an $Al_2O_3$ film or a $Ta_2O_5$ film can be used alone or in combination.

Then, as illustrated in FIG. 4F, a gate electrode 5 is formed on the gate insulating film 4. The gate electrode 5 has the thickness of about 200 nm to about 500 nm, and is formed of a poly-crystalline silicon semiconductor film or an amorphous silicon semiconductor film which are formed by low pressure CVD or of an amorphous silicon semiconductor film or a crystalline silicon semiconductor film which are formed by plasma CVD. When any of these silicon semiconductor films is used, an impurity is introduced in order to have low resistivity. Alternately, the gate electrode 5 may be formed by forming a Ta film or a metal film containing Al, AlSi, AlTi, AlSc or the like to the above-described thickness by sputtering. In particular, the metal film containing Al is preferable in that it forms low resistance electrode lines. That is, if the gate electrode 5 is formed of a metal material containing Al, then a low resistance gate or bus line can be formed. In particular, in the case where TFTs to be formed are used in a liquid crystal display, it is preferable that the gate or the bus line are formed of a low resistance material so that signal delay due to the CR time constant becomes small, which is another reason why the use of an Al based metal material is desirable.

When the gate electrode 5 is formed of an Al based metal material, it is preferable to coat the surface of the gate electrode 5 with an anodic oxide film (not shown in the figure) by anodic oxidation treatment. That is, if the Al based metal material is used, a protrusion (referred to as a hillock) may grow on the surface during the ion implantation step or the annealing step for the production of the TFT. However, by coating the surface with the anodic oxide film, the growth of hillocks can be inhibited.

Then, the silicon-containing semiconductor film 3 which has been crystallized and patterned is self-aligningly doped with an impurity 8 to a concentration of, for example, about $1\times10^{15}$ cm$^{-2}$ to about $5\times10^{15}$ cm$^{-2}$ with the gate electrode 5 being used as a mask. As a result, a region which is masked with the gate electrode 5 and is therefore not doped with the impurity 8 becomes a channel region 3C of the TFT 400 to be formed, and regions which are not masked and is therefore doped with the impurity 8 become a source region 3S and a drain region 3D of the TFT 400.

If the TFT 400 is to be formed as an n-type, then the silicon-containing semiconductor film 3 is doped with an n-type impurity so that the source region 3S and the drain region 3D become n-type semiconductors. On the other hand, if the TFT 400 is to be formed as a p-type, then the silicon-containing semiconductor film 3 is doped with a p-type impurity. Those which can be used as the n-type impurity include a group V element such as phosphorous, and those which can be used as the p-type impurity include a group III element such as boron.

For example, when phosphorous is to be doped, a PH$_3$ gas is used as a doping gas, and the ion implantation is performed with the acceleration voltage of about 60 kV to about 100 kV and a dose of about $1\times10^{15}$ cm$^{-2}$ to about $1\times10^{16}$ cm$^{-2}$. When boron is to be the dopant, B$_2$H$_6$ gas is used as a doping gas, and the ion implantation is performed with the acceleration voltage of about 30 kV to about 80 kV and a dose of about $1\times10^{15}$ cm$^{-2}$ to about $1\times10^{16}$ cm$^{-2}$.

Then, in order to electrically activate the doped impurity, activation annealing is performed. Specifically, annealing using a furnace, laser annealing, lamp annealing or the like can be performed. This completes the TFT 400 having the structure illustrated in FIG. 4G.

The source line 2S and the drain line 2D can be electrically lead out by etching away the gate insulating film 4 with the gate electrode 5 being used as a mask.

As described above, the TFT 400 can be formed by simple fabrication steps. Four photolithographic masks are required in the above steps, namely, a mask for forming the source/drain lines 2S and 2D, a mask for forming the contact holes 7S and 7D, a mask for patterning the silicon-containing semiconductor film 3 and a mask for patterning the gate electrode 5.

Furthermore, since the crystalline semiconductor film containing silicon can be formed by using at least one of Ni, Fe, Co and Pt as the catalyst element, a poly-crystalline semiconductor film having considerably good crystallinity is obtained. Accordingly, the TFT including such poly-crystalline semiconductor film has considerably good operational characteristics. Moreover, since the catalyst element also serves as a constituting material for the source/drain lines 2S and 2D, the removal of the catalyst element after the crystallization is not necessary.

In the above-described step shown in FIG. 4A, a shielding film 2SH can also be formed at the location between the source line 2S and the drain line 2D. As already described in connection with the previous embodiments, the provision of such shielding film 2SH can inhibit a negative effect to the TFT to be formed due to light entering from the substrate 1 side. Accordingly, the TFT having excellent light resistivity can be obtained.

(Embodiment 5)

A liquid crystal display apparatus formed with the TFTs according to the present invention, and a production method thereof will be described here.

Figure 5:
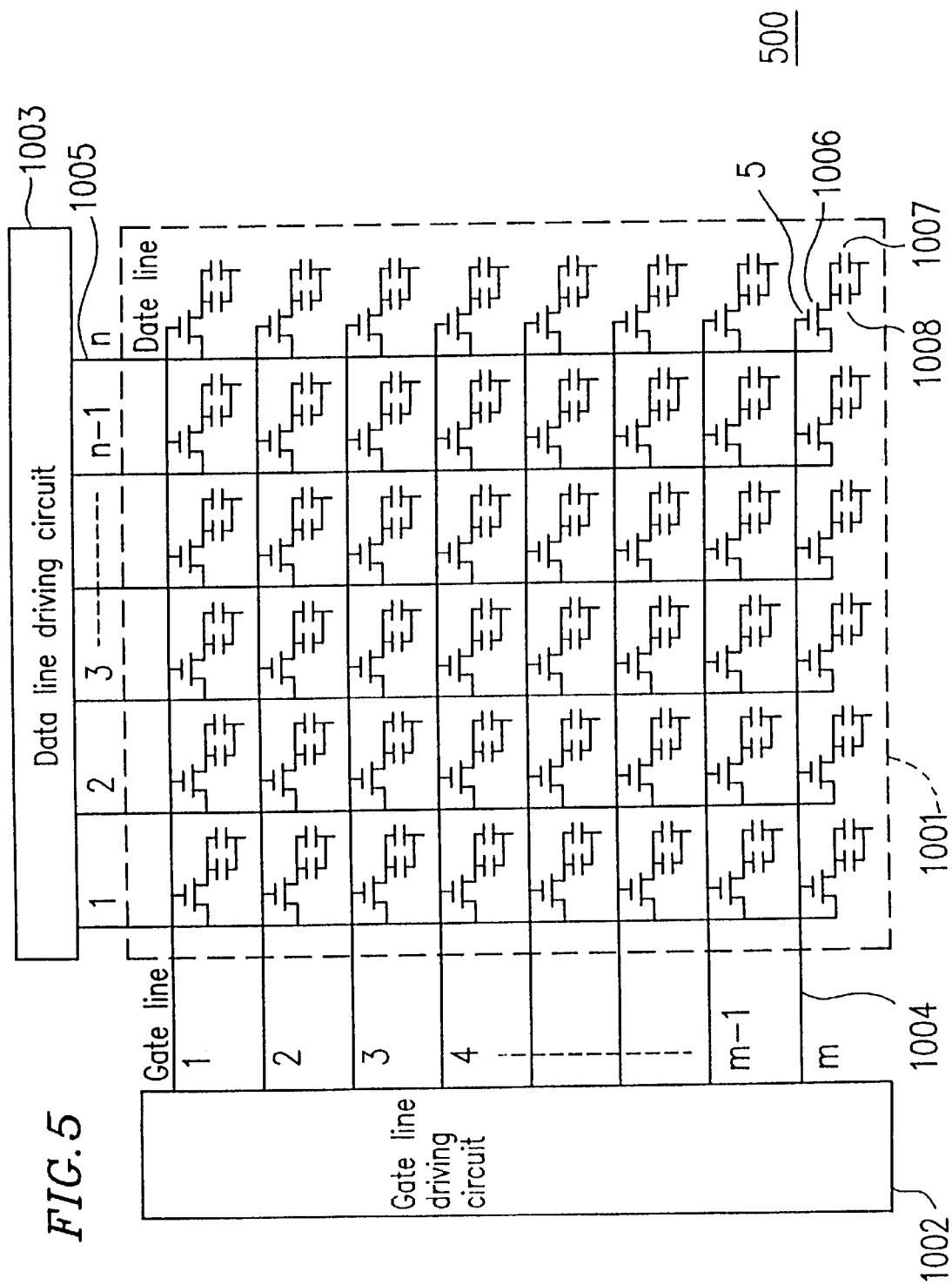
FIG. 5 is a plan view illustrating the structure of a liquid crystal display apparatus according to the present invention.

FIG. 5 is a structural diagram of a liquid crystal display apparatus according to a fifth embodiment of the present invention, and FIG. 6 is an isometric view of the display unit of the liquid crystal display apparatus 500. Moreover, FIGS. 7A and 7B, FIGS. 8A and 8B, and FIGS. 9A and 9B are views illustrating the structure of the TFT which may be included in the display unit of the liquid crystal display apparatus 500.

As illustrated in FIG. 5, the liquid crystal display apparatus has the display unit 1001 including a plurality of (m number of) gate lines (scanning lines) 1004 and a plurality of (n number of) data lines 1005. The gate lines 1004 and the data lines 1005 are mutually crossing one another. A TFT 1006 is formed and connected to a liquid crystal unit 1007 and to an storage capacitor 1008 in the vicinity of each intersection. Each gate line 1004 is connected to the gates 5 of the TFTs 1006. Moreover, provided in the vicinity of the display unit 1001 are a gate line driving circuit 1002 and a data line driving circuit 1003, which are connected to the TFT 1006 by the gate lines 1004 and the data lines 1005, respectively.

As illustrated in FIG. 6, the TFTs 1006, the scanning lines 1004, the data lines 1005 and the pixel electrodes 2007 are formed on the substrate 2001. For each TFT 1006, the gate elect-ode 5 is connected to the gate line 1004. Similarly, the source is connected to the data line 1005, and the drain is connected to the pixel electrode 2007. Furthermore, an alignment film (not shown in the figure) is further provided to the substrate 2001.

Moreover, a common electrode 2008, a color filter 2009 and a second alignment film (not shown in the figure) are formed on an opposing substrate 2002. The substrate 2001 and the opposing substrate 2002 face to each other with a liquid crystal layer 2003 being inserted therebetween, thereby forming a liquid crystal panel. In the above-described liquid crystal panel, a portion where the pixel electrode 2007 and the common electrode 2008 oppose to one another corresponds to each pixel (liquid crystal unit 1007).

Polarizing plates 2010 and 2011 are provided to the outside of the substrates 2001 and 2002, respectively, which constitute the liquid crystal panel. White light 2012 is radiated from either one of the sides of the substrates 2001 and 2002 so that the display is done by transmitting light. In FIG. 6, the white light 2012 is radiated from the substrate 2001 side.

In each TFT 1006, a semiconductor layer including a source region, a drain region and a channel region is formed on the substrate 2001, and a gate electrode 5 is formed thereon with a gate insulating film being inserted therebetween. The data lines 1005 are formed on the substrate 2001. Each data line 1005 is connected to the sources of the TFTs 1006 either directly or through a contact hole provided in interlayer insulating film.

Figure 7A:
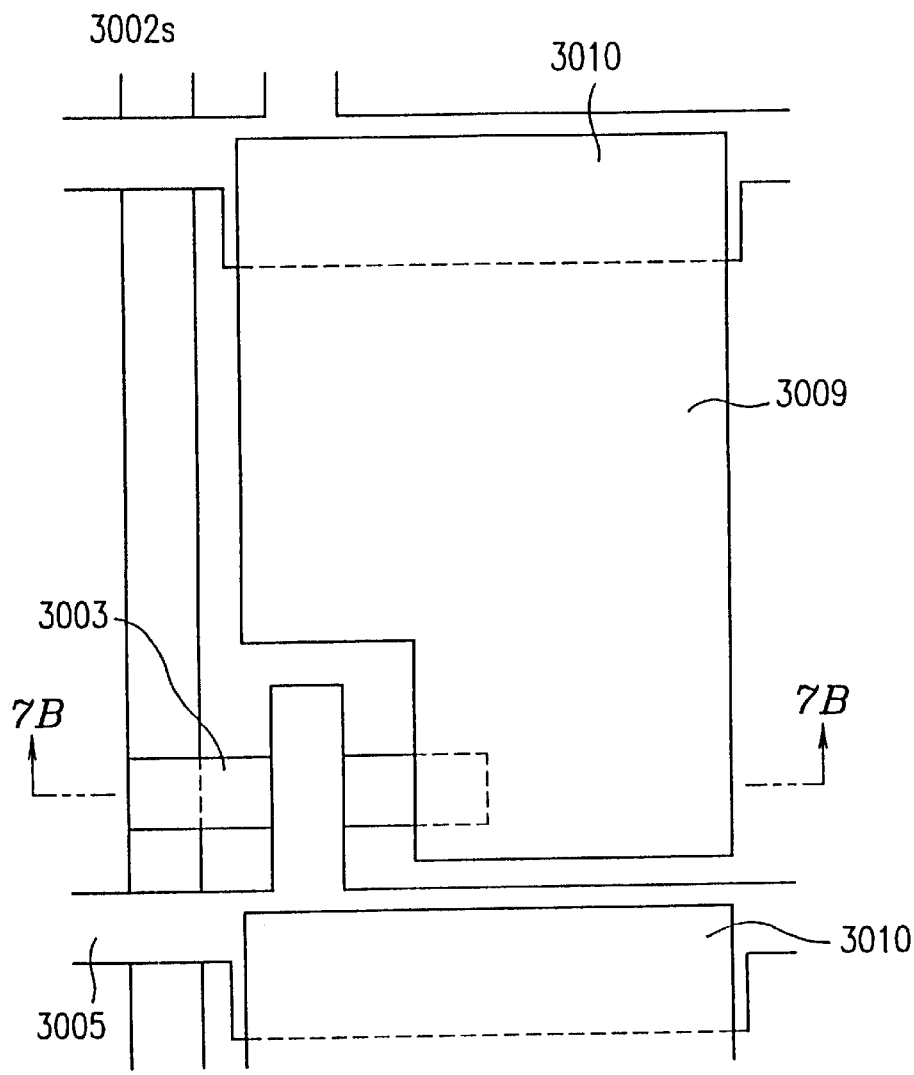
FIG. 7A is a plan view illustrating the structure of a thin film transistor which may be included in a pixel unit of the display unit shown in FIG. 6.
Figure 7B:
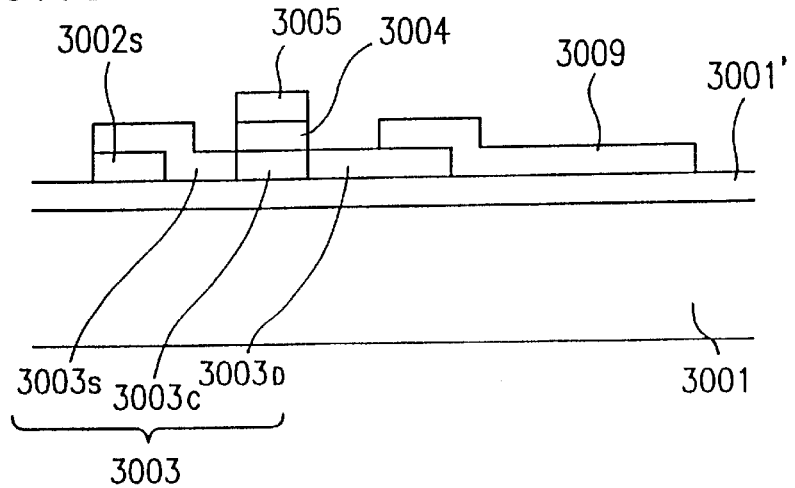
FIG. 7B is a cross-sectional view taken along line B–B' in FIG. 7A.

FIG. 7A is a plan view illustrating the structure of one of the pixels, and FIG. 7B is a cross-sectional view taken along line B–B' in FIG. 7A.

Constituent elements of the pixel unit are formed on an insulating substrate 3001. Those which can be used as the insulating substrate 3001 include a glass substrate, a quartz substrate, a sapphire substrate or a mono-crystalline silicon wafer substrate having an insulating layer formed on its surface.

When a glass substrate is used as an insulating substrate 3001, it is preferable to coat the surface of the substrate 3001 with a coating film 3001' made of an $SiO_2$ film, an $SiN_x$ or the like so as to prevent the negative effect of the impurity contained in the substrate 3001. The thickness of the coating film 3001' is, for example, about 100 nm to about 500 nm. Those which can be used as the coating film 3001' include an $SiO_2$ film which is formed by atmospheric pressure CVD from an $SiH_4$ gas and an $O_2$ gas used as a material gas at the temperature of about 430° C., and an $SiO_2$ film formed by sputtering, low pressure CVD, plasma CVD or remote plasma CVD. An $SiN_x$ film, an $Al_2O_3$ film or a $Ta_2O_5$ film can also be used. Furthermore, the above-mentioned films can be used in combination.

Provided on the coating film 3001' is a source line 3002S. The source line 3002S is formed of a single layer film made of a material containing at least one of nickel (Ni), iron (Fe), cobalt (Co) and platinum (Pt) or of a multi-layer film including a film made of such materials as the upper-most surface layer, such as a Ni single layer film, a Ni/Mo laminated layer film and a Ni/Ta laminated layer film. The Ni, Fe, Co or Pt introduced into the source line 3002S function as the catalyst element which prompts the crystallization during the crystallization step to be described later for forming a semiconductor film containing silicon. Typically, the thickness of the source line 3002S is about 200 nm to about 500 nm.

A silicon-containing semiconductor film 3003 is formed on the surface of the coating film 3001' and the source line 3002S. Those which can be used as a material for the silicon-containing semiconductor film 3003 includes Si or SiGe, or silicon semiconductor containing phosphorus or boron. In the following description, a poly-crystalline silicon film 3003 is ultimately obtained as the silicon-containing semiconductor film 3003. Typically, the thickness of the silicon-containing semiconductor film 3003 is about 30 nm to about 150 nm.

The crystallization of the poly-crystalline film 3003 is obtained first by forming the film which contains an amorphous portion and then by annealing the film. During the crystallization, it is not necessary that the whole portion of the semiconductor film 3003 be in the amorphous phase before the crystallization. The amorphous portion may be formed as a micro-crystalline semiconductor film or as a poly-crystalline semiconductor film partially in the amorphous phase.

The silicon-containing semiconductor film 3003 including an amorphous portion can be formed by plasma CVD at the substrate temperature of about 200° C. to about 300° C. from a material gas including an $SiH_4$ gas and a $H_2$ gas, or by low pressure CVD at the substrate temperature of about 400° C. to about 570° C. from a material gas including an $SiH_4$ gas and an $Si_2H_6$. Then, the annealing is performed so that the crystallization of the silicon-containing semiconductor film 3003 proceeds, starting with a portion which is in contact with the source line 3002S which contains the catalyst element for crystallization. During the crystallization, the catalyst element contained in the source line 3002S is taken into the silicon-containing semiconductor film 3003, and is localized at the growth front of the crystallization, thereby prompting the crystallization of the silicon-containing semiconductor film 3003.

In the above process, the concentration of the catalyst element becomes high at the growth front of the crystallization. Here, the catalyst element itself is not desirable for the characteristics of the silicon-containing semiconductor film 3003 obtained as a result of the crystallization. If the concentration is too high, then the device characteristics are adversely affected. In the above-described crystallization process, since the crystallization of the silicon-containing semiconductor film 3003 proceeds from the portion which is in contact with the source line 3002S, the growth front ultimately comes in the middle between the two neighboring source lines 3002S, and the concentration of the catalyst element becomes extremely high there. Therefore, it is preferable that such region of high concentration of the catalyst element does not come to a position corresponding to the channel region 3003C (below the gate electrode 3005) of the TFT to be described later.

The crystallinity of the crystallized silicon-containing semiconductor film 3003 can be further improved by irradiating it with high intensity light such as laser light and lamp light. If a pulse laser of short wavelength is used as the light source, then damage is preferably not inflicted to the underlying insulating substrate 3001. Those which can be used include a excimer laser such as a XeCl laser (wavelength of 308 nm), a KrF laser (wavelength 248 nm), an ArF laser (wavelength of 193 nm), etc.

The crystallized silicon-containing semiconductor film 3003 is patterned in an island configuration. A gate insulating film 3004 having the thickness of about 50 nm to about 150 nm is formed on the patterned silicon-containing semiconductor film 3003. As the gate insulating film 3004, an $SiO_2$ film which is formed by atmospheric pressure CVD at the temperature of about 430° C. using a material gas including an $SiH_4$ gas and a $O_2$ gas can be used. Alternatively, an $SiO_2$ film which is formed by sputtering, low pressure CVD, plasma CVD or remote plasma CVD can be used as the gate insulating film 3004. Moreover, if an $SiO_2$ film which is formed by atmospheric pressure CVD or plasma CVD using TEOS, then the gate insulating film 3004 having excellent step coatability can be obtained. Alternatively, instead of the above-described $SiO_2$ film, an $SiN_x$ film, an $Al_2O_3$ film or a $Ta_2O_5$ film can be used alone or in combination.

A gate electrode 3005 is formed on the gate insulating film 3004. The gate electrode 3005 has the thickness of about 200 nm to about 500 nm, and is formed of a poly-crystalline silicon semiconductor film or an amorphous silicon semiconductor film which are formed by low pressure CVD or of an amorphous silicon semiconductor film or a crystalline silicon semiconductor film which are formed by plasma CVD. When any of these silicon semiconductor films is used, an impurity is introduced in order to have low resistivity. Alternately, the gate electrode 3005 may be formed by forming a Ta film or a metal film containing Al, AlSi, AlTi, AlSc or the like to the above-described thickness by sputtering. In particular, the metal film containing Al is preferable in that it forms low resistance electrode lines.

The silicon-containing semiconductor film 3003 which has been crystallized and patterned is doped with an impurity to a concentration of, for example, about $1 \times 10^{15}$ cm$^{-2}$ to about $5 \times 10^{15}$ cm$^{-2}$ with the gate electrode 3005 being used as a mask. As a result, a region which is masked with the gate electrode 3005 and is therefore not doped with the impurity becomes a channel region 3003C of the TFT to be formed, and regions which are not masked and is therefore doped with the impurity become a source region 3003S and a drain region 3003D of the TFT. If the TFT is to be formed as an n-type, then the silicon-containing semiconductor film 3003 is doped to a high concentration with an n-type impurity, for example, a group V element such as phosphorous so that the source region 3003S and the drain region 3003D become n-type semiconductors. On the other hand, if the TFT is to be formed as a p-type, then the silicon-containing semiconductor film 3003 is doped to a high concentration with a p-type impurity, for example, a group III element such as boron.

The source line 3002S and the drain region 3003D can be electrically lead out by etching away the gate insulating film 3004 with the gate electrode 3005 being used as a mask.

Furthermore, a pixel electrode 3009 is formed of a transparent metal film such as ITO on a predetermined region of the coating film 3001' enclosed by the two neighboring gate lines 3005 and source lines 3002S. Then, anodic oxidation is performed on the gate electrode 3005 to form an anodic oxide film (not shown in the figure) on its surface. Accordingly, an storage capacitor 3010 (Cs) is formed with the anodic oxide film (insulating film) being a dielectric film and with the gate electrode 3005 and the pixel electrode 3009 being a lower electrode and an upper electrode, respectively. However, the storage capacitor 3010 can be formed by other methods.

According to the above-described method, the TFT as one of the constituent elements of the liquid crystal display apparatus can be formed by simple fabrication steps. Three photolithographic masks are required in the above steps, namely, a mask for forming the source line 3002S, a mask for patterning the silicon-containing semiconductor film 3003 and a mask for patterning the gate electrode 3005.

Furthermore, since the crystalline semiconductor film containing silicon can be formed by using at least one of Ni, Fe, Co and Pt as the catalyst element, a poly-crystalline semiconductor film having considerably good crystallinity is obtained. Accordingly, the TFT including such poly-crystalline semiconductor film has considerably good operational characteristics. Moreover, since the catalyst element is introduced as a constituting material for the source line 3002S which is to be included in a finished product, the step of removing constituting elements including the catalyst element after the crystallization step is not necessary.

Figure 8A:
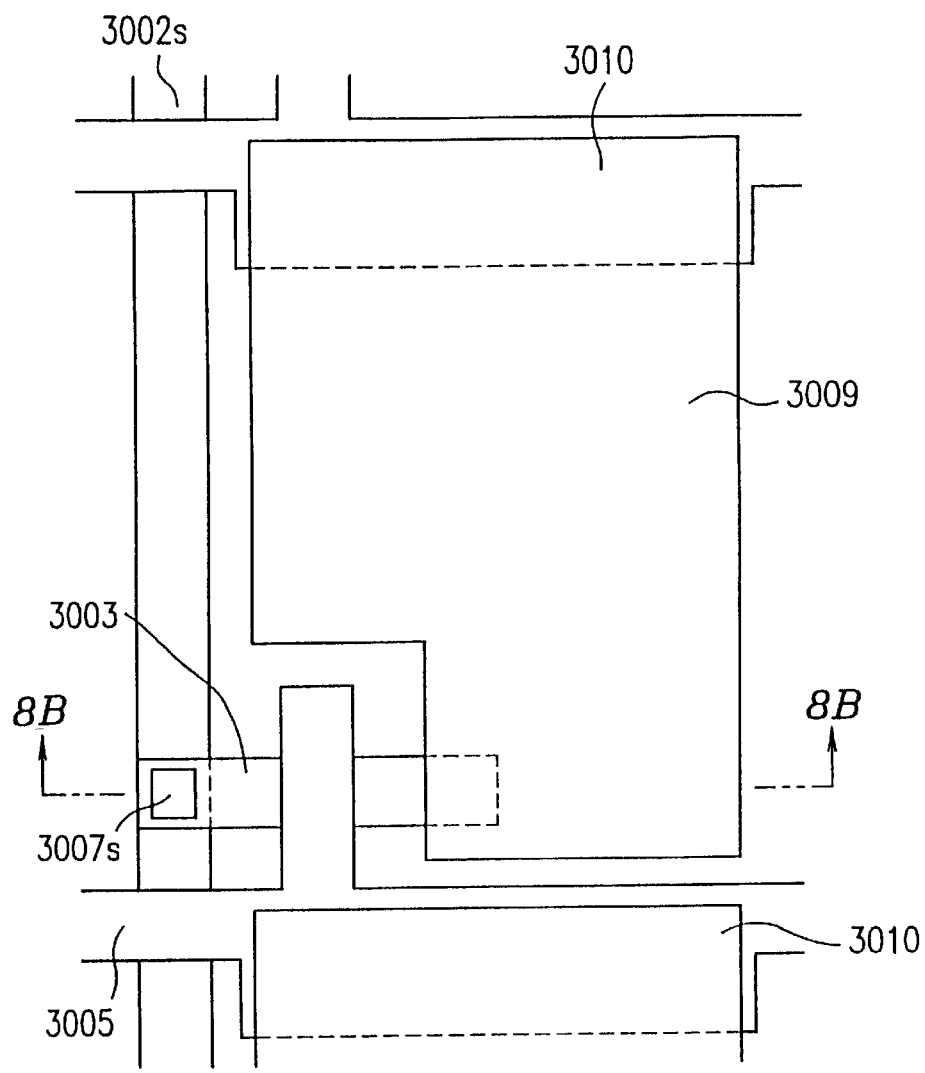
FIG. 8A is a plan view illustrating another structure of a thin film transistor which may be included in a pixel unit of the display unit shown in FIG. 6.
Figure 8B:
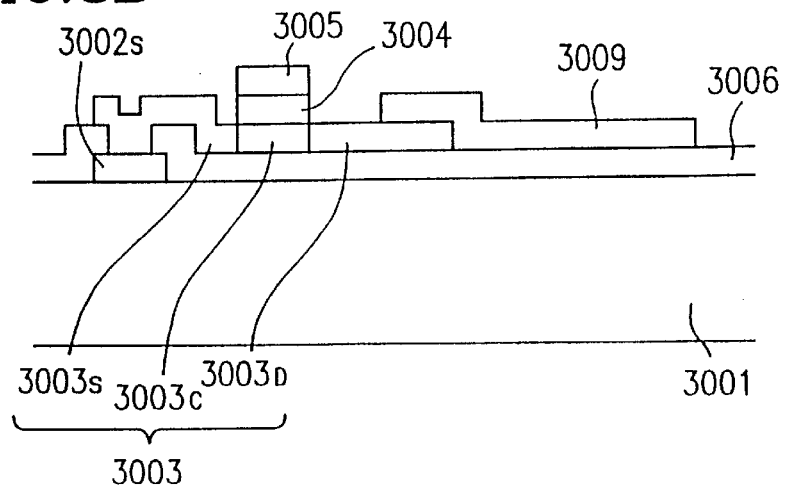
FIG. 8B is a cross-sectional view taken along line B–B' in FIG. 8A.

FIG. 8A is a plan view illustrating the structure of the pixel unit, and FIG. 8B is a cross-sectional view taken along line B–B' in FIG. 8A.

A pixel unit in FIGS. 8A and 8B differs from the pixel unit previously described with reference to FIGS. 7A and 7B in that, in the pixel unit shown in FIGS. 8A and 8B, an interlayer insulating film 3006 which also functions as a coating film is provided on the surface of the insulating substrate 3001. This makes it possible to omit the formation of the coating layer. The same constituent elements in FIGS. 8A and 8B are designated by the same reference numerals as in FIGS. 7A and 7B.

Constituent elements of the pixel unit are formed on the insulating substrate 3001. Those which can be used as the insulating substrate 3001 include a glass substrate, a quartz substrate, a sapphire substrate, or a mono-crystalline silicon wafer substrate having an insulating layer formed on its surface.

Provided on the insulating substrate 3001 is a source line 3002S. The source line 3002S is formed of a single layer film made of a material containing at least one of nickel (Ni), iron (Fe), cobalt (Co) and platinum (Pt) or of a multi-layer film including a film made of such materials as the uppermost surface layer, such as a Ni single layer film, a Ni/Mo laminated layer film and a Ni/Ta laminated layer film. The Ni, Fe, Co or Pt introduced into the source line 3002S functions as the catalyst element which prompts the crystallization during the crystallization step to be described later for forming a semiconductor film containing silicon. Typically, the thickness of the source line 3002S is about 200 nm to about 500 nm.

The interlayer insulating film 3006 having a thickness of about 100 nm to about 500 nm is formed so as to cover the surface of the insulating substrate 3001 and the source line 3002S. As described above, the interlayer insulating film 3006 also functions as the coating film for preventing a negative effect due to the impurity contained in the substrate 3001. In order for the interlayer insulating film 3006 to function as the coating film, it is preferable that the interlayer insulating film 3006 be formed of a $SiO_2$ film or a $SiN_x$ film.

When the interlayer insulating film 3006 is formed of a $SiO_2$ film, the interlayer insulating film 6 can be formed by atmospheric pressure CVD at the temperature of about 430° C. using a material gas including a $SiH_4$ gas and an $O_2$ gas. The interlayer insulating film 6 may be formed by sputtering, atmospheric pressure CVD, low pressure CVD, plasma CVD or remote plasma CVD. Moreover, by using the $SiO_2$ film formed by atmospheric pressure CVD or plasma CVD using TEOS, the interlayer insulating film 3006 having excellent step coatability can be formed. Alternatively, instead of the above-mentioned $SiO_2$ film, an $SiN_x$ film, an $Al_2O_3$ film or a $Ta_2O_5$ film can be used alone or in combination.

By forming the interlayer insulating film 3006 as described above, the withstand voltage between the source line 3002S and the gate electrode 3005 at their intersection improves, and the parasitic capacitance occurring there can be reduced.

A contact hole 3007S is formed by etching in the interlayer insulating film 3006 at the location corresponding to the source line 3002S.

A silicon-containing semiconductor film 3003 is formed on the interlayer insulating film 3006. Those which can be used as a material for the silicon-containing semiconductor film 3003 includes Si or SiGe, or silicon semiconductor containing phosphorus or boron. In the following description, a poly-crystalline silicon film 3003 is ultimately obtained as the silicon-containing semiconductor film 3003. Typically, the thickness of the silicon-containing semiconductor film 3003 is about 30 nm to about 150 nm.

The crystallization of the poly-crystalline film 3003 is obtained first by forming the film which contains an amorphous portion and then by annealing the film. During the crystallization, it is not necessary that the whole portion of the semiconductor film 3003 be in the amorphous phase before the crystallization. The amorphous portion may be formed as a micro-crystalline semiconductor film or as a poly-crystalline semiconductor film partially in the amorphous phase.

The silicon-containing semiconductor film 3003 including an amorphous portion can be formed by plasma CVD at the substrate temperature of about 200° C. to about 300° C. from a material gas including an $SiH_4$ gas and a $H_2$ gas, or by low pressure CVD at the substrate temperature of about 400° C. to about 570° C. from a material gas including an $SiH_4$ gas and an $Si_2H_6$ gas. Then, the annealing is performed so that the crystallization of the silicon-containing semiconductor film 3003 proceeds, starting with a portion which is in contact with the source line 3002S which contains the catalyst element for crystallization. During the crystallization, the catalyst element contained in the source line 3002S is taken into the silicon-containing semiconductor film 3003, and is localized at the growth front of the crystallization, thereby prompting the crystallization of the silicon-containing semiconductor film 3003.

In the above process, the concentration of the catalyst element becomes high at the growth front of the crystallization. Here, the catalyst element itself is not desirable for the characteristics of the silicon-containing semiconductor film 3003 obtained as a result of the crystallization. If the concentration is too high, then the device characteristics are wrongly affected. In the above-described crystallization process, since the crystallization of the silicon-containing semiconductor film 3003 proceeds from the portion which is in contact with the source line 3002S, the growth front ultimately comes in the middle between the two neighboring source lines 3002S, and the concentration of the catalyst element becomes extremely high there. Therefore, it is preferable that such region of high concentration of the catalyst element does not come to a position corresponding to the channel region 3003C (below the gate electrode 3005) of the TFT to be described later.

The crystallinity of the crystallized silicon-containing semiconductor film 3003 can be further improved by irradiating it with high intensity light such as laser light and lamp light. If a pulse laser of short wavelength is used as the light source, then damage is preferably not inflicted to the underlying insulating substrate 3001. Those which can be used include a excimer laser such as a XeCl laser (wavelength of 308 nm), a KrF laser (wavelength 248 nm), an ArF laser (wavelength of 193 nm), etc.

The crystallized silicon-containing semiconductor film 3003 is patterned in an island configuration. A gate insulating film 3004 having the thickness of about 50 nm to about 150 nm is formed on the patterned silicon-containing semiconductor film 3003. As the gate insulating film 3004, an $SiO_2$ film which is formed by atmospheric pressure CVD at the temperature of about 430° C. using a material gas including an $SiH_4$ gas and a $O_2$ gas can be used. Alternatively, an $SiO_2$ film which is formed by any one of sputtering, low pressure CVD, plasma CVD or remote plasma CVD can be used as the gate insulating film 3004. Moreover, if an $SiO_2$ film which is formed by atmospheric pressure CVD or plasma CVD using TEOS, then the gate insulating film 3004 having excellent step coatability can be obtained. Alternatively, instead of the above-described $SiO_2$ film, an $SiN_x$ film, an $Al_2O_3$ film or a $Ta_2O_5$ film can be used alone or in combination.

A gate electrode 3005 is formed on the gate insulating film 3004. The gate electrode 3005 has the thickness of about 200 nm to about 500 nm, and is formed of a poly-crystalline silicon semiconductor film or an amorphous silicon semiconductor film which are formed by low pressure CVD or of an amorphous silicon semiconductor film or a crystalline silicon semiconductor film which are formed by plasma CVD. When any of these silicon semiconductor films is used, an impurity is introduced in order to have low resistivity. Alternately, the gate electrode 3005 may be formed by forming a Ta film or a metal film containing Al, AlSi, AlTi, AlSc or the like to the above-described thickness by sputtering. In particular, the metal film containing Al is preferable in that it forms low resistance electrode lines.

The silicon-containing semiconductor film 3003 which has been crystallized and patterned is doped with an impurity to a concentration of, for example, about $1 \times 10^{15}$ cm$^{-2}$ to about $5 \times 10^{15}$ cm$^{-2}$ with the gate electrode 5 being used as a mask. As a result, a region which is masked with the gate electrode 3005 and is therefore not doped with the impurity becomes a channel region 3003C of the TFT to be formed, and regions which are not masked and is therefore doped with the impurity become a source region 3003S and a drain region 3003D of the TFT. If the TFT is to be formed as an n-type, then the silicon-containing semiconductor film 3003 is doped to a high concentration with an n-type impurity, for example, a group V element such as phosphorous so that the source region 3003S and the drain region 3003D become n-type semiconductors. On the other hand, if the TFT is to be formed as a p-type, then the silicon-containing semiconductor film 3003 is doped to a high concentration with a p-type impurity, for example, a group III element such as boron.

The source line 3002S and the drain region 3003D can be electrically lead out by etching away the gate insulating film 3004 with the gate electrode 3005 being used as a mask.

Furthermore, a pixel electrode 3009 is formed of a transparent metal film such as ITO on a predetermined region of the interlayer insulating film 3006 enclosed by the two neighboring gate lines 3005 and source lines 3002S. Then, anodic oxidation is performed on the gate electrode 3005 to form an anodic oxide film (not shown in the figure) on its surface. Accordingly, a storage capacitor 3010 (Cs) is formed with the anodic oxide film (insulating film) being a dielectric film and with the gate electrode 3005 and the pixel electrode 3009 being a lower electrode and an upper electrode, respectively. However, the storage capacitor 3010 can be formed by other methods.

According to the above-described method, the TFT as one of the constituent elements of the liquid crystal display apparatus can be formed by simple fabrication steps. Four photolithographic masks are required in the above steps, namely, a mask for forming the source line 3002S, a mask for forming the contact hole 3007S, a mask for patterning the silicon-containing semiconductor film 3003 and a mask for patterning the gate electrode 3005.

Furthermore, since the crystalline semiconductor film containing silicon can be formed by using at least one of Ni, Fe, Co and Pt as the catalyst element, a poly-crystalline semiconductor film having considerably good crystallinity is obtained. Accordingly, the TFT including such poly-crystalline semiconductor film has considerably good operational characteristics. Moreover, since the catalyst element is introduced as a constituting material for the source line 3002S which is to be included in a finished product, the step of removing constituting elements including the catalyst element after the crystallization step is not necessary.

Figure 9A:
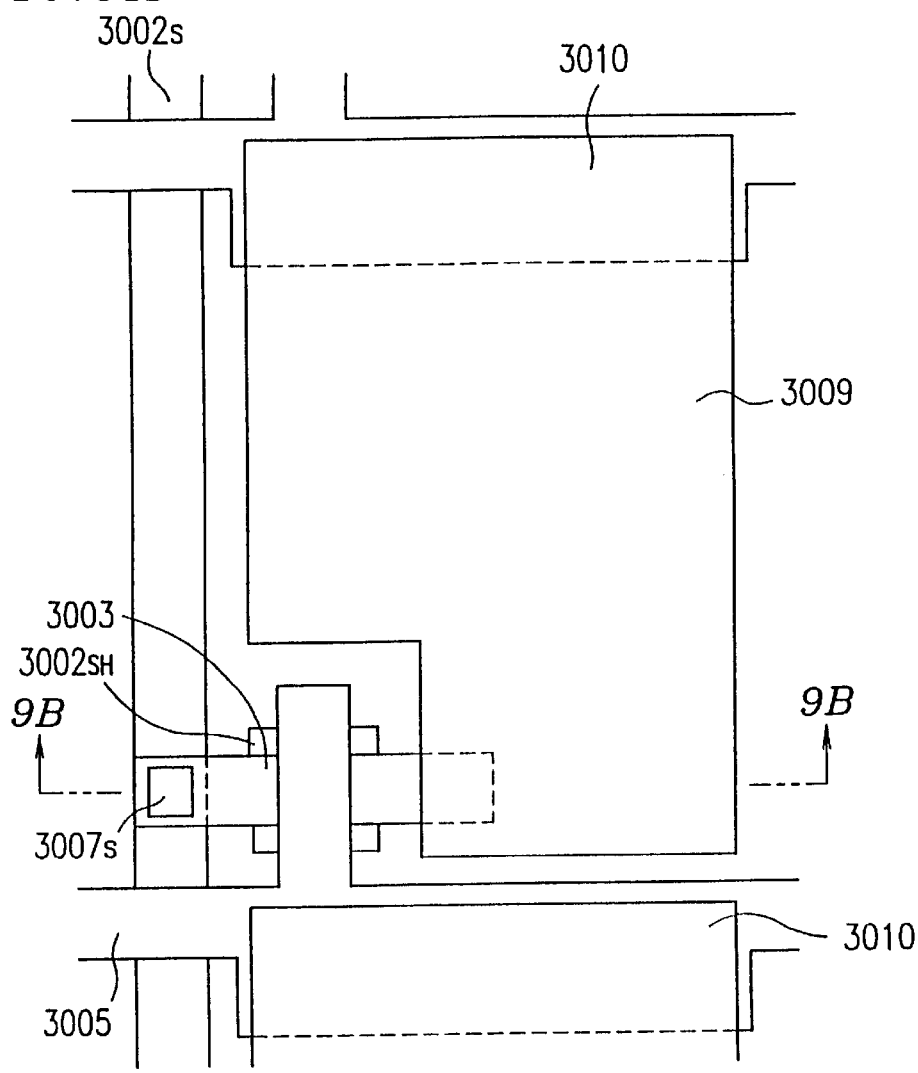
FIG. 9A is a plan view illustrating still another structure of a thin film transistor which may be included in a pixel unit of the display unit shown in FIG. 6.
Figure 9B:
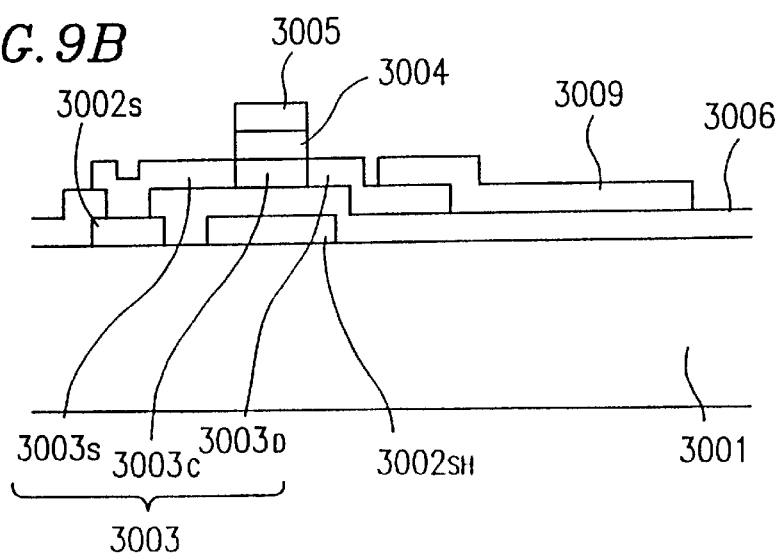
FIG. 9B is a cross-sectional view taken along line B–B' in FIG. 9A.

FIGS. 9A is a plan view illustrating the structure of one pixel unit, and FIG. 9B is a cross-sectional view taken along line B–B' in FIG. 9A.

The pixel unit in FIGS. 9A and 9B differs from the pixel unit previously described with reference to FIGS. 8A and 8B in that, in FIGS. 9A and 9B, a shielding film 3002SH is provided on the surface of the insulating substrate 3001 adjacent to the source line 3002S. This shielding film 3002SH is to prevent light entering from the substrate 3001 side from adversely affecting the TFT to be formed in the pixel unit. The same constituent elements in FIGS. 9A and 9B are designated by the same reference numerals as in FIGS. 8A and 8B.

Constituent elements of the pixel unit are formed on the insulating substrate 3001. Those which can be used as the insulating substrate 3001 include a glass substrate, a quartz substrate, a sapphire substrate, or a mono-crystalline silicon wafer substrate having an insulating layer formed on its surface.

Provided on the insulating substrate 3001 are a source line 3002S and a shielding film 3002SH. The source line 3002S and the shielding film 3002SH are formed of a single layer film made of a material containing at least one of nickel (Ni), iron (Fe), cobalt (Co) and platinum (Pt) or of a multi-layer film including a film made of such materials as the uppermost surface layer, such as a Ni single layer film, a Ni/Mo laminated layer film and a Ni/Ta laminated layer film. The Ni, Fe, Co or Pt introduced into the source line 3002S and the shielding film 3002SH functions as the catalyst element which prompts the crystallization during the crystallization step to be described later for forming a semiconductor film containing silicon. Typically, the thickness of the source line 3002S and the shielding film 3002SH is about 200 nm to about 500 nm.

The interlayer insulating film 3006 having a thickness of about 100 nm to about 500 nm is formed so as to cover the surface of the insulating substrate 3001, the source line 3002S and the shielding film 3002SH. As described above, the interlayer insulating film 3006 also functions as the coating film for preventing a negative effect due to the impurity contained in the substrate 3001. In order for the interlayer insulating film 3006 to function as the coating film, it is preferable that the interlayer insulating film 3006 be formed of a $SiO_2$ film or a $SiN_x$ film.

When the interlayer insulating film 3006 is formed of a $SiO_2$ film, the interlayer insulating film 6 can be formed by atmospheric pressure CVD at the temperature of about 430° C. using a material gas including a $SiH_4$ gas and an $O_2$ gas. The interlayer insulating film 6 may be formed by sputtering, atmospheric pressure CVD, low pressure CVD, plasma CVD or remote plasma CVD. Moreover, by using the $SiO_2$ film formed by atmospheric pressure CVD or plasma CVD using TEOS, the interlayer insulating film 3006 having excellent step coatability can be formed. Alternatively, instead of the above-mentioned $SiO_2$ film, an $SiN_x$ film, an $Al_2O_3$ film or a $Ta_2O_5$ film can be used alone or in combination.

By forming the interlayer insulating film 3006 as described above, the withstand voltage between the source line 3002S and the gate electrode 3005 at their intersection improves, and the parasitic capacitance occurring there can be reduced.

Furthermore, a contact hole 3007S is formed by etching in the interlayer insulating film 3006 at the location corresponding to the source line 3002S.

Next, a silicon-containing semiconductor film 3003 is formed on the interlayer insulating film 3006. Those which can be used as a material for the silicon-containing semiconductor film 3003 include Si or SiGe, or silicon semiconductor containing phosphorus or boron. In the following description, a poly-crystalline silicon film 3003 is ultimately obtained as the silicon-containing semiconductor film 3003. Typically, the thickness of the silicon-containing semiconductor film 3003 is about 30 nm to about 150 nm.

The crystallization of the poly-crystalline film 3003 is obtained first by forming the film which contains an amorphous portion and then by annealing the film. During the crystallization, it is not necessary that the whole portion of the semiconductor film 3003 be in the amorphous phase before the crystallization. The amorphous portion may be formed as a micro-crystalline semiconductor film or as a poly-crystalline semiconductor film partially in the amorphous phase.

The silicon-containing semiconductor film 3003 including an amorphous portion can be formed by plasma CVD at the substrate temperature of about 200° C. to about 300° C. from a material gas including an $SiH_4$ gas and a $H_2$ gas, or by low pressure CVD at the substrate temperature of about 400° C. to about 570° C. from a material gas including an $SiH_4$ gas and an $Si_2H_6$ gas. Then, the annealing is performed so that the crystallization of the silicon-containing semiconductor film 3003 proceeds, starting with a portion which is in contact with the source line 3002S which contains the catalyst element for crystallization. During the crystallization, the catalyst element contained in the source line 3002S is taken into the silicon-containing semiconductor film 3003, and is localized at the growth front of the crystallization, thereby prompting the crystallization of the silicon-containing semiconductor film 3003.

In the above process, the concentration of the catalyst element becomes high at the growth front of the crystallization. Here, the catalyst element itself is not desirable for the characteristics of the silicon-containing semiconductor film 3003 obtained as a result of the crystallization. If the concentration is too high, then the device characteristics are adversely affected. In the above-described crystallization process, since the crystallization of the silicon-containing semiconductor film 3003 proceeds from the portion which is in contact with the source line 3002S, the growth front ultimately comes in the middle between the two neighboring the source lines 3002S, and the concentration of the catalyst element becomes extremely high there. Therefore, it is preferable that such region of high concentration of the catalyst element does not come to a position corresponding to the channel region 3003C (below the gate electrode 3005) of the TFT to be described later.

The crystallinity of the crystallized silicon-containing semiconductor film 3003 can be further improved by irradiating it with high intensity light such as laser light and lamp light. If a pulse laser of short wavelength is used as the light source, then damage is preferably not inflicted to the underlying insulating substrate 3001. Those which can be used include a excimer laser such as a XeCl laser (wavelength of 308 nm), a KrF laser (wavelength 248 nm), an ArF laser (wavelength of 193 nm), etc.

The crystallized silicon-containing semiconductor film 3003 is patterned in an island configuration. A gate insulating film 3004 having the thickness of about 50 nm to about 150 nm is formed so as to cover the patterned silicon-containing semiconductor film 3003. As the gate insulating film 3004, an $SiO_2$ film which is formed by atmospheric pressure CVD at the temperature of about 430° C. using a material gas including an $SiH_4$ gas and a $O_2$ gas can be used. Alternatively, an $SiO_2$ film which is formed by sputtering, low pressure CVD, plasma CVD or remote plasma CVD can be used as the gate insulating film 3004. Moreover, if an $SiO_2$ film which is formed by atmospheric pressure CVD or plasma CVD using TEOS, then the gate insulating film 3004 having excellent step coatability can be obtained. Alternatively, instead of the above-described $SiO_2$ film, an $SiN_x$ film, an $Al_2O_3$ film or a $Ta_2O_5$ film can be used alone or in combination.

A gate electrode 3005 is formed on the gate insulating film 3004. The gate electrode 3005 has the thickness of about 200 nm to about 500 nm, and is formed of a poly-crystalline silicon semiconductor film or an amorphous silicon semiconductor film which are formed by low pressure CVD or of an amorphous silicon semiconductor film or a crystalline silicon semiconductor film which are formed by plasma CVD. When any of these silicon semiconductor films is used, an impurity is introduced in order to have low resistivity. Alternately, the gate electrode 3005 may be formed by forming a Ta film or a metal film containing Al, AlSi, AlTi, AlSc or the like to the above-described thickness by sputtering. In particular, the metal film containing Al is preferable in that it forms low resistance electrode lines.

The silicon-containing semiconductor film 3003 which has been crystallized and patterned is doped with an impurity to a concentration of, for example, about $1 \times 10^{15}$ $cm^{-2}$ to about $5 \times 10^{15}$ $cm^{-2}$ with the gate electrode 3005 being used as a mask. As a result, a region which is masked with the gate electrode 3005 and is therefore not doped with the impurity becomes a channel region 3003C of the TFT to be formed, and regions which are not masked and are therefore doped with the impurity become a source region 3003S and a drain region 3003D of the TFT. If the TFT is to be formed as an n-type, then the silicon-containing semiconductor film 3003 is doped to a high concentration with an n-type impurity, for example, a group V element such as phosphorous so that the source region 3003S and the drain region 3003D become n-type semiconductors. On the other hand, if the TFT is to be formed as a p-type, then the silicon-containing semiconductor film 3003 is doped to a high concentration with a p-type impurity, for example, a group III element such as boron.

The source line 3002S and the drain region 3003D can be electrically taken out by etching away the gate insulating film 3004 with the gate electrode 3005 being used as a mask.

Furthermore, a pixel electrode 3009 is formed of a transparent metal film such as ITO on a predetermined region of the interlayer insulating film 3006 enclosed by the two neighboring gate lines 3005 and source lines 3002S. Then, anodic oxidation is performed on the gate electrode 3005 to form an anodic oxide film (not shown in the figure) on its surface. Accordingly, an storage capacitor 3010 (Cs) is formed with the anodic oxide film (insulating film) being a dielectric film and with the gate electrode 3005 and the pixel electrode 3009 being a lower electrode and an upper electrode, respectively. However, the storage capacitor 3010 can be formed by other methods.

According to the above-described method, the TFT as one of the constituent elements of the liquid crystal display apparatus can be formed by simple fabrication steps. Four photolithographic masks are required in the above steps, namely, a mask for forming the source line 3002S and the shielding film 3002SH, a mask for forming the contact hole 3007S, a mask for patterning the silicon-containing semiconductor film 3003 and a mask for patterning the gate electrode 3005.

Furthermore, since the crystalline semiconductor film containing silicon can be formed by using at least one of Ni, Fe, Co and Pt as the catalyst element, a poly-crystalline semiconductor film having considerably good crystallinity is obtained. Accordingly, the TFT including such poly-crystalline semiconductor film has considerably good operational characteristics. Moreover, since the catalyst element is introduced as a constituting material for the source line 3002S which is to be included in a finished product, the step of removing constituting elements including the catalyst element after the crystallization step is not necessary.

Furthermore, by providing the shielding film 3002SH which can also be formed in the step of forming the source line 3002S, the TFT having excellent light resistivity can be obtained.

Accordingly, a liquid crystal display apparatus having high display definition can be obtained.

As described above, because of the above-described structure, the semiconductor device or the thin film transistor according to the present invention can be readily produced in a fewer number of production steps. For example, the number of photolithographic masks needed for the production becomes small.

Furthermore, because of the lines formed of a single layer film made of a material containing at least one of nickel, iron, cobalt and platinum or of a multi-layer film, the crystallization proceeds with the above-mentioned material functioning as a catalyst, starting with the portion which is in contact with the lines, and the semiconductor film having excellent crystallinity can be obtained in the annealing for the crystallization of the semiconductor film including silicon including an amorphous portion. In the above-described structure, the catalyst material for the crystallization also serves as a constituting material of the lines. Therefore, it is not necessary to perform the step for removing the portion including the catalyst after the production of the semiconductor apparatus or the thin film transistor. Accordingly, the production steps can be simplified. Moreover, fine control on the concentration of introduced catalyst is not required, and excellent uniformity of devices to be formed as well as excellent repeatability can be achieved. The device is thus suited for mass production. Moreover, by using the catalyst element such as the one described above, the silicon-containing semiconductor film having excellent crystallinity can be obtained by annealing at a temperature lower than the typical crystallization temperature for amorphous silicon by about 20° C. to about 150° C. If the annealing temperature can be lowered, then an inexpensive glass substrate having low heat resistance can be used.

Furthermore, by using the thin film transistor which has the simple structure as described above as well as excellent crystallinity and operational characteristics, the liquid crystal display apparatus which has high display definition can be easily and inexpensively obtained.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A semiconductor device, comprising:
   a substrate;
   a line formed on said substrate; and
   a crystalline semiconductor film containing silicon in contact with said line, wherein:
   said line electrically connects said crystalline semiconductor film to a location outside of said semiconductor device, and said line contains an element which functions as a catalyst for crystallizing said crystalline semiconductor film on annealing.

2. A semiconductor device according to claim 1, further comprising an insulating film formed on said line, wherein said crystalline semiconductor film is in contact with said line through a contact hole formed in said insulating film.

3. A semiconductor device according to claim 1, wherein said line is formed of a single layer film or of a multi-layer film made of a constituting material containing at least one material selected from the group consisting of nickel, iron, cobalt and platinum.

4. A thin film transistor, comprising:
   a substrate;
   a line formed on said substrate;
   a crystalline semiconductor film containing silicon in contact with said line;
   a gate insulating film formed on said crystalline semiconductor film; and
   a gate electrode formed on said gate insulating film, wherein
   said line electrically connects said crystalline semiconductor film to a location outside of said semiconductor device, and said line contains an element which functions as a catalyst for crystallizing said crystalline semiconductor film on annealing.

5. A thin film transistor according to claim 4, further comprising an insulating film formed on said line, wherein said crystalline semiconductor film is in contact with said line through a contact hole formed in said insulating film.

6. A thin film transistor according to claim 4, wherein: said crystalline semiconductor film includes a source region and a drain region; and said source region and said drain region are selectively doped with a group III element or a group V element as an impurity.

7. A thin film transistor according to claim 6, wherein said impurity is doped self-aligningly with said gate electrode being used as a mask.

8. A thin film transistor according to claim 4, further comprising a shielding film formed on said substrate in the same step as for said line.

9. A thin film transistor according to claim 4, wherein said line is formed of a single layer film or of a multi-layer film made of a constituting material containing at least one material selected from the group consisting of nickel, iron, cobalt and platinum.

10. A liquid crystal display apparatus, comprising at least one thin film transistor according to claim 4.

\* \* \* \* \*